United States Patent [19]
Yano et al.

[11] Patent Number: 5,576,247
[45] Date of Patent: Nov. 19, 1996

[54] THIN LAYER FORMING METHOD WHEREIN HYDROPHOBIC MOLECULAR LAYERS PREVENTING A BPSG LAYER FROM ABSORBING MOISTURE

[75] Inventors: Kousaku Yano; Masayuki Endo; Yuka Terai, all of Osaka; Noboru Nomura, Kyoto; Tomoyasu Murakami, Osaka; Tetsuya Ueda, Osaka; Satoshi Ueda, Osaka, all of Japan

[73] Assignee: Matsushita Electric Industrial Co., Ltd., Osaka, Japan

[21] Appl. No.: 97,231

[22] Filed: Jul. 27, 1993

[30] Foreign Application Priority Data

Jul. 31, 1992 [JP] Japan .................................... 4-204659

[51] Int. Cl.$^6$ .............................................. H01L 21/316
[52] U.S. Cl. ........................................... 437/225; 437/240
[58] Field of Search ............................ 357/71; 437/240, 437/231, 225, 238, 238, 239

[56] References Cited

U.S. PATENT DOCUMENTS

| | | | |
|---|---|---|---|
| 4,885,262 | 12/1989 | Ting et al. | 437/231 |
| 4,940,673 | 7/1990 | Ponjee et al. | 437/225 |
| 5,094,983 | 3/1992 | Furthaler et al. | 437/225 |
| 5,132,774 | 7/1992 | Matsuura et al. | 357/71 |
| 5,286,681 | 2/1994 | Maeda et al. | 437/240 |
| 5,405,805 | 4/1995 | Homma | 437/195 |

FOREIGN PATENT DOCUMENTS

| | | | |
|---|---|---|---|
| 0643421 | 3/1995 | European Pat. Off. | H01L 23/29 |
| 63-117429 | 5/1988 | Japan | H01L 21/318 |
| 01149423 | 6/1989 | Japan | H01L 21/285 |
| 91019317 | 12/1991 | WIPO | H01L 21/312 |

OTHER PUBLICATIONS

K. Ahmed et al., "Borophosphosilicate Glass Crystal Induction and Suppression", J. Vac. Sci Technol., A10(2), pp. 313–14 (Mar./Apr. 1992).
Wolf, Stanley 'Silicon Processing for the VLSI Era', vol. 2, pp. 235–136 (1990).
Yano, Kousaku 'Improved Interconnect Yield Through Surface Control Silylation (SCS) Method', 1993 Symposium on VLSI Tech.
Yano, Kousaku 'Suppression of Prec. in BPSG Films by Surface Control by Silylation (SCS) Process Aug. 1992 Intern. Conf. on Solid State Devices.
Wolf, Stanley, 'Si Proc. for VLSI Era', VLS2 Lattice Press (1990) pp. 188–196.

*Primary Examiner*—R. Bruce Breneman
*Assistant Examiner*—Matthew Whipple
*Attorney, Agent, or Firm*—McDermott, Will & Emery

[57] ABSTRACT

A BPSG layer serving as a silicon oxide layer is formed on a semiconductor substrate 1. Formed on the surface of the BPSG layer is a hydrophobic molecular layer comprising hydrophobic groups such as methyl, ethyl and the like, by a silylation reaction (in which silyl having hydrophobic groups such as methyl groups, ethyl groups and the like, is reacted with OH groups, and in which the hydrophobic groups are substituted with H of the OH groups to generate —O—Si(CH$_3$)$_3$ or the like). The molecular layer prevents the BPSG layer from absorbing moisture.

3 Claims, 25 Drawing Sheets

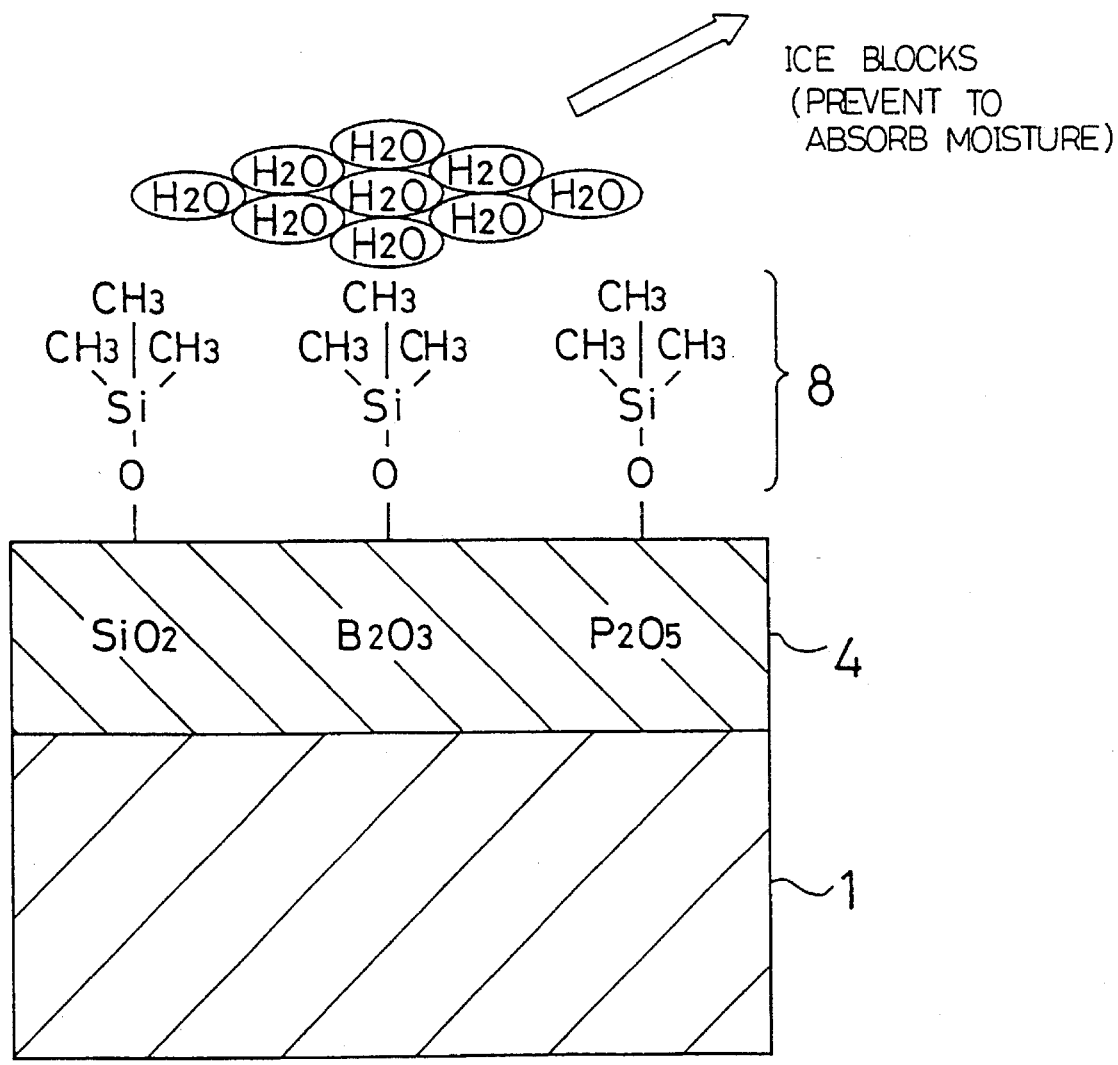

Prior Art

Prior Art

THIN LAYER FORMING METHOD WHEREIN HYDROPHOBIC MOLECULAR LAYERS PREVENTING A BPSG LAYER FROM ABSORBING MOISTURE

BACKGROUND OF THE INVENTION

The present invention relates to a thin layer forming method and a semiconductor device producing method, and more particularly to a thin layer forming method and a semiconductor device producing method by each of which a flattened insulating layer or the like can be formed in a VLSI producing process or the like.

In a semiconductor device producing method, there has been recently required, for high integration and miniaturization of VLSIs, a technique of forming a flat insulating layer under a low-temperature condition.

The following description will discuss a conventional thin layer forming method and a conventional semiconductor device producing method with reference to attached drawings.

FIG. 13 (a) to (f) are section views illustrating the respective steps of a conventional method of producing a semiconductor device by which a flattened interlaminar insulating layer is formed on polysilicon electrodes serving as lower electrodes formed on a semiconductor substrate and an upper wiring pattern is formed on the interlaminar insulating layer.

As shown in FIG. 13 (a), gate electrodes 3 comprising polysilicon are formed on a semiconductor substrate 1 through gate oxide layers 2. On the semiconductor substrate 1, there are formed the sources and drains of MOS transistors, LOCOS oxide layers and the like, which are not shown for convenience sake.

As shown in FIG. 13 (b), formed on the semiconductor substrate 1 and the gate electrodes 3 is a silicate glass layer 4 serving as a flattened insulating layer containing boron and phosphorus (hereinafter referred to as BPSG layer) by a normal-pressure CVD method, the BPSG layer 4 being deposited in a thickness of 700 nm. In FIG. 13 (b), precipitates 5 are generated on the surface of the BPSG layer 4.

As shown in FIG. 13 (c), the BPSG layer 4 is thermally treated to soften the glass therein, causing the BPSG layer 4 to be flowingly flattened. As shown in FIG. 13 (d), first photoresists 6A having a desired resist pattern are formed on the BPSG layer 4, which is then etched.

As shown in FIG. 13 (e), after the first photoresists 6A have been removed, a metallic layer 7 of an aluminium-based alloy serving as an upper electrode is formed on the BPSG layer 4 by a sputtering method. Second photoresists 6B corresponding to a wiring pattern are formed on the metallic layer 7. As shown in FIG. 13 (f), the metallic layer 7 is etched. Thereafter, the second photoresists 6B are removed to form a wiring pattern 7' of the metallic layer.

As the method of flattening the BPSG layer, i.e., as the thermal treating method of softening glass (hereinafter referred to glass flow planarization), there are generally known two examples, in one of which the glass flow planarization is conducted in a nitrogen atmosphere and in the other of which the glass flow planarization is conducted in an oxygen/hydrogen atmosphere (hereinafter referred to as pyrogenic atmosphere).

According to a normal method in which glass flow planarization is conducted in a nitrogen atmosphere, a BPSG layer containing impurities such as boron, phosphorus and the like in prevailing concentrations, requires a heating treatment at a temperature in the vicinity of 900° C. for thirty minutes. In a highly integrated element such as a 64-MDRAM or the like, however, diffusion zones for the sources and drains of MOS transistors are small. Accordingly, when a high-temperature heating treatment as above-mentioned is conducted, the profiles of impurities in the diffusion zones are changed. This makes it difficult to achieve a highly integrated element such as a 64-MDRAM.

It is therefore required to conduct the glass flow planarization at a lower temperature. As a method of conducting the glass flow planarization under 900° C., e.g., 850° C., it is considered to conduct the glass flow planarization in a pyrogenic atmosphere, instead of a nitrogen atmosphere.

As shown in FIG. 14, there occurs, in glass flow planarization in a pyrogenic atmosphere, a phenomenon that metallic electrodes and gate electrodes below a BPSG layer, and the transistor diffusion zones are oxidized. Accordingly, the polysilicon gate electrodes and the metallic electrodes are reduced in thickness. This increases the resistance or decreases the diffusion zones. Therefore, it is disadvantageously difficult to use glass flow planarization in a pyrogenic atmosphere.

In glass flow planarization to be conducted in a nitrogen atmosphere, it is considered to set, to high levels, the concentrations of impurities such as boron, phosphorus and the like, causing the temperature of heating treatment to be lowered.

With a scanning electron microscope, the inventors observed those portions of the BPSG layer 4 on the broad and flat semiconductor substrate 1 that had a thickness identical with that of each of the gate electrodes 3 after the glass flow planarization shown in FIG. 13 (c) had been conducted. Then, the inventors measured a flattened angle θ serving as an index which represented a flatness obtained by the glass flow planarization (See FIG. 15). At this time, the BPSG layer had a thickness of 400 nm.

FIG. 16 shows the results of a test in which, with the impurity concentration of each BPSG layer variously changed, glass flow planarization was conducted in a nitrogen atmosphere at each of temperatures of 850° C. and 900° C. for 30 minutes, and the flattened angles θ were measured. As apparent from FIG. 16, the BPSG layers were flattened more satisfactorily as the impurity concentration was increased. As to the temperature of glass flow planarization, the BPSG layer 4 was flattened more satisfactorily at 900° C. than at 850° C. In a highly integrated LSI, metallic wirings formed on a BPSG layer are fine. Accordingly, there is required an angle of not more than 25° as the flattened angle θ for preventing the metallic wirings from being disconnected or short-circuited. Thus, as apparent from FIG. 16, there are required an impurity concentration of not less than 14 mol % for glass flow planarization at 900° C., and an impurity concentration of not less than 19 mol % for glass flow planarization at 850° C.

However, a BPSG layer containing impurities in high concentration presents the problem that the impurities therein absorb moisture in the air after the BPSG layer has been formed, so that precipitates are generated with the impurities serving as cores. FIG. 17 shows the relation between the time during which the BPSG layer has been preserved in the air, and precipitates generated from impurities in terms of the number of particles. FIG. 17 shows the results of a test in which BPSG layers having different impurity concentrations and each having a thickness of 400 nm, were respectively deposited on mirror-like silicon substrates and in which, with the use of a particle detecting device for conducting a reflection measurement by scanning laser light on the surfaces of the BPSG layers, the precipitates were measured for numbers at several times for hundreds hours immediately after the deposition of the BPSG layers. As apparent from FIG. 17, there was observed an increase in the number of precipitates in a very short period of time with an increase in impurity concentration, and the precipitates were remarkably generated for an impurity concentration of about 19 mol % or more. Even though the concentrations of boron and phosphorus are low, such precipitates are generated since boron and phosphorus absorb a great amount of moisture.

Since such precipitates remain after the BPSG layer has been flattened, the metallic wirings formed on the BPSG layer are disconnected or short-circuited. This disadvantageously makes it difficult to achieve a highly integrated transistor.

SUMMARY OF THE INVENTION

In view of the foregoing, the object of the present invention is such that, although glass flow planarization at a low temperature such as 850° C. or the like, is conducted on a silicon oxide layer having a high impurity concentration formed on a substrate, e.g., a BPSG layer formed on gate electrodes, metallic electrodes, diffusion zones and the like on a semiconductor substrate, the silicon oxide layer on the substrate does not absorb moisture to prevent precipitates from being generated on the silicon oxide layer.

To achieve the object above-mentioned, the present invention provides a first thin layer forming method of forming, on the surface of a silicon oxide layer, a molecular layer comprising molecules having hydrophobic groups, by a silylation reaction (in which silyl having hydrophobic groups such as methyl groups, ethyl groups or the like is reacted with OH groups, and in which the hydrophobic groups are substituted with H of the OH groups), so that the hydrophobic groups of the molecules of this molecular layer prevent the silicon oxide layer from absorbing moisture.

More specifically, a first thin layer forming method according to the present invention comprises: a first step of forming, on a substrate, a silicon oxide layer containing at least one substance selected from the group consisting of boron, phosphorus and arsenic; a second step of forming a molecular layer comprising molecules having hydrophobic groups on the surface of the silicon oxide layer formed at the first step; and a third step of forming a thin layer on the silicon oxide layer on the surface of which the molecular layer has been formed at the second step.

According to the method above-mentioned, since the molecular layer comprising the molecules having the hydrophobic groups is formed on the surface of the silicon oxide layer formed at the first step, the hydrophobic groups of the molecules forming the molecular layer prevent moisture from entering the silicon oxide layer. Accordingly, even though the silicon oxide layer contains impurities in high concentration, the silicon oxide layer does not absorb moisture. Therefore, precipitates are hardly generated on the silicon oxide layer.

Further, the molecular layer prevents the occurrence of a phenomenon that substances produced as a result of moisture absorption by B and P, are outwardly diffused due to heating treatment and come out from the surface of the silicon oxide layer. This reduces a flattened angle obtained after glass flow planarization.

Preferably, the first thin layer forming method is arranged such that the second step is adapted to supply a material containing hydrophobic groups bonded with silicon or germanium, onto the silicon oxide layer formed at the first step, so that the hydrophobic groups are bonded with oxygen of the silicon oxide layer, thus forming, on the surface of the silicon oxide layer, a molecular layer comprising molecules having the hydrophobic groups, the hydrophobic groups of the molecules of the molecular layer preventing moisture from entering the silicon oxide layer.

The method above-mentioned can securely form, on the surface of the silicon oxide layer, a molecular layer comprising molecules of hydrophobic groups.

Preferably, the first thin layer forming method is arranged such that the second step is carried out before precipitates are generated on the surface of the silicon oxide layer formed at the first step.

The method above-mentioned can perfectly restrain precipitates from being generated on the surface of the silicon oxide layer.

Preferably, the first thin layer forming method further comprises, between the first and second steps, a step of thermally treating the silicon oxide layer formed at the first step.

According to the method above-mentioned, the heating treatment causes the silicon oxide layer to be fine. Further, Si, B, P or As forming the silicon oxide layer is sufficiently bonded with oxygen. This greatly reduces the silicon oxide layer in hygroscopic property. Further, the heating treatment restrains the generation of OH groups which are hydrophilic and liable to absorb moisture. This further restrains the generation of precipitates.

According to a second thin layer forming method of the present invention, a hydrophobic molecular layer is again formed on the surface of a silicon oxide layer which has been thermally treated. Accordingly, even though a substrate is placed in a highly humid atmosphere or the concentrations of boron and phosphorus in the silicon oxide layer become uneven so that boron and phosphorus are locally present, no precipitates are generated.

More specifically, a second thin layer forming method according to the present invention comprises: a first step of forming, on a substrate, a silicon oxide layer containing at least one substance selected from the group consisting of boron, phosphorus and arsenic; a second step of forming a first molecular layer comprising molecules having hydrophobic groups, on the surface of the silicon oxide layer formed at the first step; a third step of thermally heating the silicon oxide layer on the surface of which the first molecular layer has been formed at the second step; a fourth step of forming a second molecular layer comprising molecules having hydrophobic groups, on the surface of the silicon oxide layer as thermally treated at the third step; and a fifth step of forming a thin layer on the silicon oxide layer on the surface of which the second molecular layer has been formed at the fourth step.

Thus, the first molecular layer formed on the surface of the silicon oxide layer, prevents moisture from entering the silicon oxide layer, after which the silicon oxide layer is thermally treated. Then, the second molecular layer is formed on the surface of the silicon oxide layer thus thermally treated. This second molecular layer prevents moisture from entering the silicon oxide layer. This securely prevents the generation of precipitates which are liable to be generated when the substrate is placed in a highly humid atmosphere or when the concentrations of impurities in the silicon oxide layer become uneven so that B and P are locally present.

Preferably, the second thin layer forming method is arranged such that the second step is adapted to supply a material containing hydrophobic groups bonded with silicon or germanium, onto the silicon oxide layer formed at the first step, so that the hydrophobic groups are bonded with oxygen of the silicon oxide layer, thus forming, on the surface of the silicon oxide layer, the first molecular layer comprising molecules having the hydrophobic groups, the hydrophobic groups of the molecules of the first molecular layer preventing moisture from entering the silicon oxide layer; and the fourth step is adapted to supply a material containing hydrophobic groups bonded with silicon or germanium, onto the silicon oxide layer as thermally treated at the third step, so that the hydrophobic groups are bonded with oxygen of the silicon oxide layer as thermally treated, thus forming, on the surface of the silicon oxide layer, the second molecular layer comprising molecules having the hydrophobic groups, the hydrophobic groups of the molecules of the second molecular layer preventing moisture from entering the silicon oxide layer.

According to the method above-mentioned, the first molecular layer comprising the molecules having the hydrophobic groups can be securely formed on the surface of the silicon oxide layer formed at the first step, and the second molecular layer comprising the molecules having the hydrophobic groups can also be securely formed on the surface of the silicon oxide layer which has been thermally treated at the third step.

Preferably, the second thin layer forming method is arranged such that the second step is carried out before precipitates are generated on the surface of the silicon oxide layer formed at the first step.

The method above-mentioned can perfectly restrain precipitates from being generated on the surface of the silicon oxide layer.

A first semiconductor device producing method according to the present invention comprises: a first step of forming, on a semiconductor substrate having a transistor zone, a silicon oxide layer containing at least one substance selected from the group consisting of boron, phosphorus and arsenic; a second step of supplying a material containing hydrophobic groups bonded with silicon or germanium, onto the silicon oxide layer formed at the first step, so that the hydrophobic groups are bonded with oxygen of the silicon oxide layer, thus forming, on the surface of the silicon oxide layer, a molecular layer comprising molecules having the hydrophobic groups, the hydrophobic groups of the molecules of the molecular layer preventing moisture from entering the silicon oxide layer; and a third step of forming a wiring layer, directly or through an insulating layer, on the silicon oxide layer on the surface of which the molecular layer has been formed at the second step.

According to the method above-mentioned, the hydrophobic groups of the molecules forming the molecular layer prevent moisture from entering the silicon oxide layer. Accordingly, even though the silicon oxide layer contains impurities in high concentration, the silicon oxide layer does not absorb moisture. Accordingly, precipitates are hardly formed on the silicon oxide layer.

Further, the molecular layer prevents the occurrence of a phenomenon that substances produced as a result of moisture absorption by B or P, are outwardly diffused due to heating treatment and come out from the surface of the silicon oxide layer. This reduces a flattened angle obtained after glass flow planarization.

Preferably, the first semiconductor device producing method is arranged such that the second step is carried out before precipitates are generated on the surface of the silicon oxide layer formed at the first step.

The method above-mentioned can perfectly restrain precipitates from being generated on the surface of the silicon oxide layer.

Preferably, the first semiconductor device producing method further comprises, between the first and second steps, a step of thermally treating the silicon oxide layer formed at the first step.

According to the method above-mentioned, the silicon oxide layer becomes fine, and Si, B, P or As forming the silicon oxide layer is sufficiently bonded with oxygen. This greatly reduces the silicon oxide layer in hygroscopic property. Further, the heating treatment restrains the generation of OH groups which are hydrophilic and liable to absorb moisture. This further restrains the generation of precipitates.

A second semiconductor device producing method according to the present invention comprises: a first step of forming, on a semiconductor substrate havig a transistor zone, a silicon oxide layer containing at least one substance selected from the group consisting of boron, phosphorus and arsenic; a second step of supplying a material containing hydrophobic groups bonded with silicon or germanium, onto the silicon oxide layer formed at the first step, so that the hydrophobic groups are bonded with oxygen of the silicon oxide layer, thus forming, on the surface of the silicon oxide layer, a first molecular layer comprising molecules having the hydrophobic groups, the hydrophobic groups of the molecules of the first molecular layer preventing moisture from entering the silicon oxide layer; a third step of thermally treating the silicon oxide layer on the surface of which the first molecular layer has been formed at the second step; a fourth step of supplying a material containing hydrophobic groups bonded with silicon or germanium, onto the silicon oxide layer as thermally treated at the third step, so that the hydrophobic groups are bonded with oxygen of the silicon oxide layer as thermally treated, thus forming, on the surface of the silicon oxide layer, a second molecular layer comprising molecules having the hydrophobic groups, the hydrophobic groups of the molecules of the second molecular layer preventing moisture from entering the silicon oxide layer; and a fifth step of forming a wiring layer, directly or through an insulating layer, on the silicon oxide layer on the surface of which the second molecular layer has been formed at the fourth step.

Thus, the first molecular layer comprising molecules having hydrophobic groups is formed on the surface of the silicon oxide layer formed at the first step, and the second molecular layer comprising molecules having hydrophobic groups is formed on the surface of the silicon oxide layer thermally treated at the third step. Accordingly, the hydrophobic groups of the molecules forming the first and second molecular layers securely prevent moisture entering the silicon oxide layer. This securely prevents the generation of precipitates which are liable to be generated when the substrate is placed in a highly humid atmosphere or when the concentrations of impurities in the silicon oxide layer become uneven so that B and P are locally present.

Preferably, the second semiconductor device producing method is arranged such that the second step is carried out before precipitates are generated on the surface of the silicon oxide layer formed at the first step.

The method above-mentioned can substantially perfectly restrain precipitates from being generated on the surface of the silicon oxide layer.

DETAILED DESCRIPTION OF THE INVENTION

The following will discuss the basic principle of the present invention. A BPSG layer is basically a layer of $SiO_2$ containing $P_2O_5$ and $B_2O_3$. In particular, $P_2O_5$ and $B_2O_3$ are hygroscopic, so that $P_2O_5$ and $B_2O_3$ are changed into orthophosphoric acid ($H_3PO_4$) and orthoboric acid ($B(OH)_3$) according to the following reaction formulas:

$$P_2O_5 + 3H_2O = 2H_3PO_4$$

$$B_2O_3 + 3H_2O = 2B(OH)_3$$

Such orthophosphoric acid and orthoboric acid are collected and appear in the form of precipitates. Such phenomenon is discussed, for example, in "Borophosphosilicate glass crystal induction and suppression" in "Journal of Vacuum Science & Technology A" p. 313 K. Ahmed and C. Geisert Intel Corp.

Figure 18:
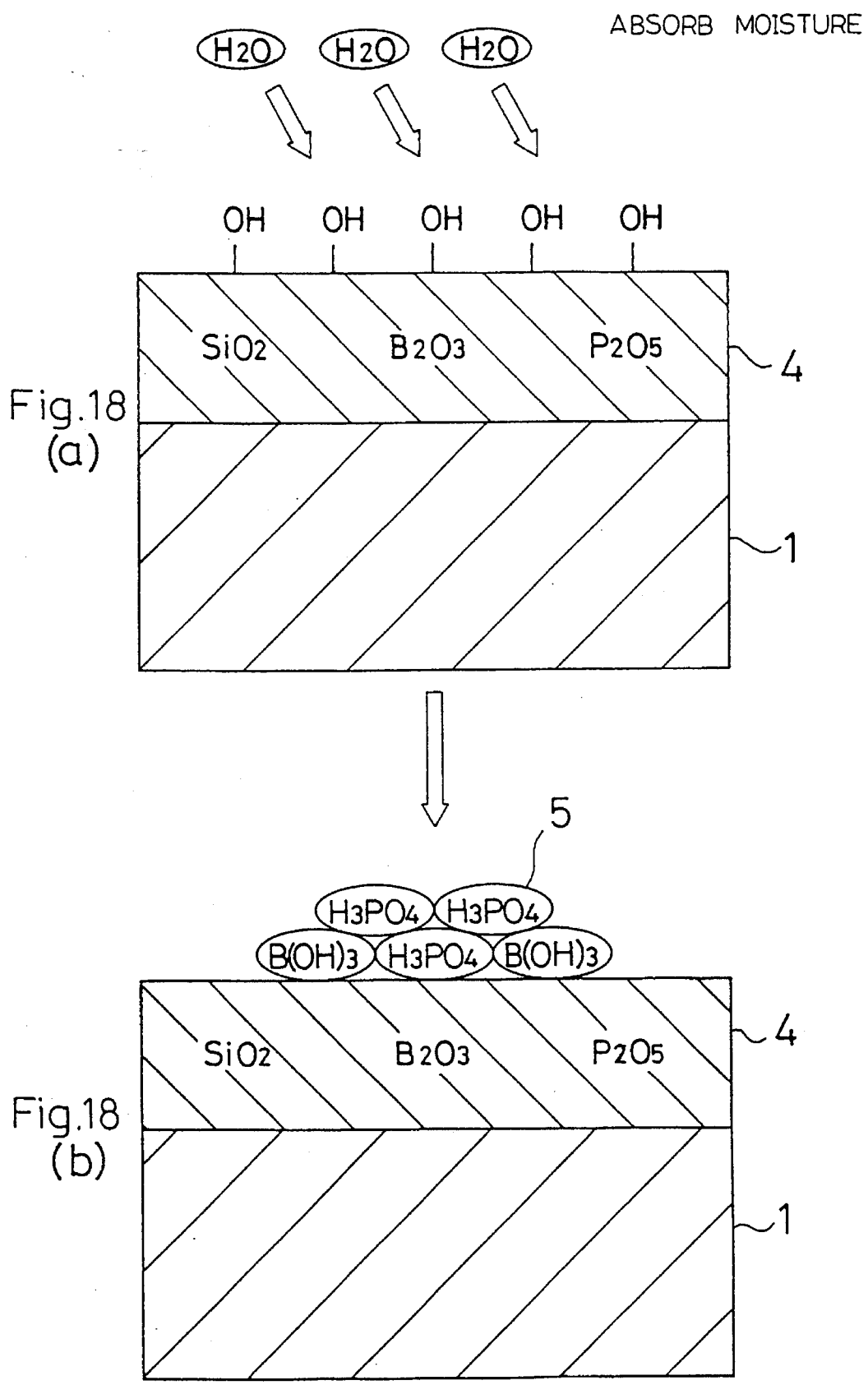
FIG. 18 (a) and (b) are views of principle of how precipitates are generated on a BPSG layer obtained according to the conventional semiconductor device producing method.

FIG. 18 (a), (b) show the phenomenon above-mentioned. As shown in FIG. 18 (a), a BPSG layer 4 formed on a substrate 1 is covered at the surface thereof with OH groups of Si—OH, B—OH or P—OH. Such a state is hydrophilic and liable to absorb moisture. Accordingly, as shown in FIG. 18 (b), the reactions above-mentioned take place in the BPSG layer 4 to generate precipitates 5.

Figure 19:
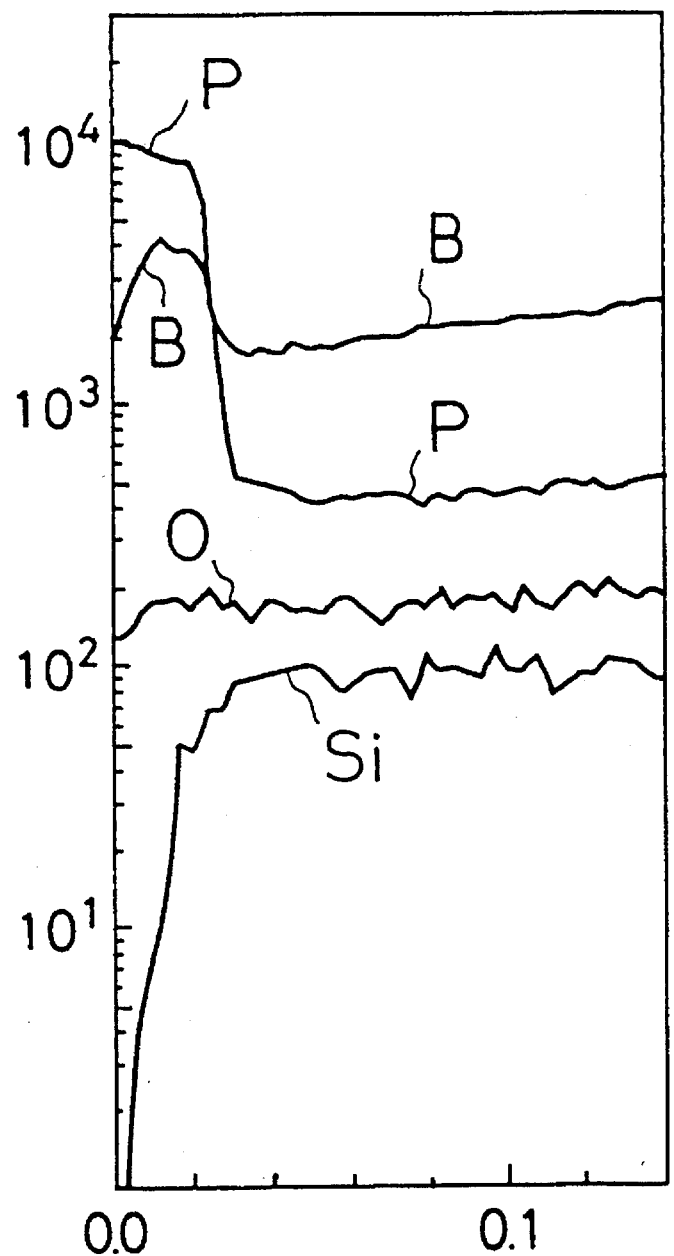
FIG. 19 shows the distributions of B and P in the depth direction of a BPSG layer obtained according to the conventional semiconductor device producing method, the distributions being obtained by SIMS analysis.

FIG. 19 shows the results of analysis on the secondary ion mass of the precipitates above-mentioned. As apparent from FIG. 19, the concentrations of the respective elements are constant in the depth direction of the BPSG layer 4 at its portion (at the substrate side) in which no precipitates are generated. At its portion (at the surface side) in which the precipitates are generated, there are observed B and P in high concentration, and the concentration of Si is lowered. Blocks of phosphoric acid and boric acid are produced.

According to the present invention, there is formed, on the surface of a silicon oxide layer, e.g., a BPSG layer, a molecular layer comprising molecules having hydrophobic groups such as methyl groups, ethyl groups or the like, by a silylation reaction (in which silyl having hydrophobic groups such as methyl groups, ethyl groups or the like is reacted with OH groups, and in which the hydrophobic groups are substituted with H of the OH groups to generate —O—Si(CH$_3$)$_3$ or the like). The hydrophobic groups of the molecules of this molecular layer prevent moisture from entering the silicon oxide layer. This prevents the silicon oxide layer from absorbing moisture.

Figure 1A:
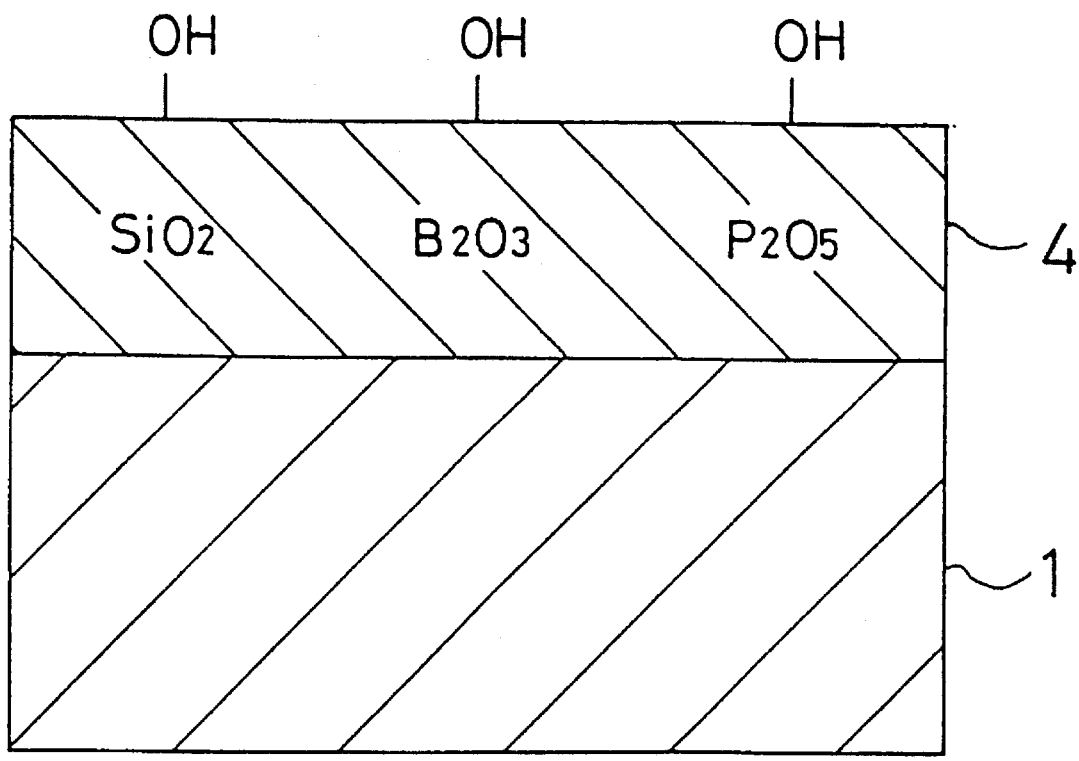
FIG. 1 (a) to (c) are schematic section views illustrating a silylation reaction which is the basic principle of the present invention.
Figure 1B:
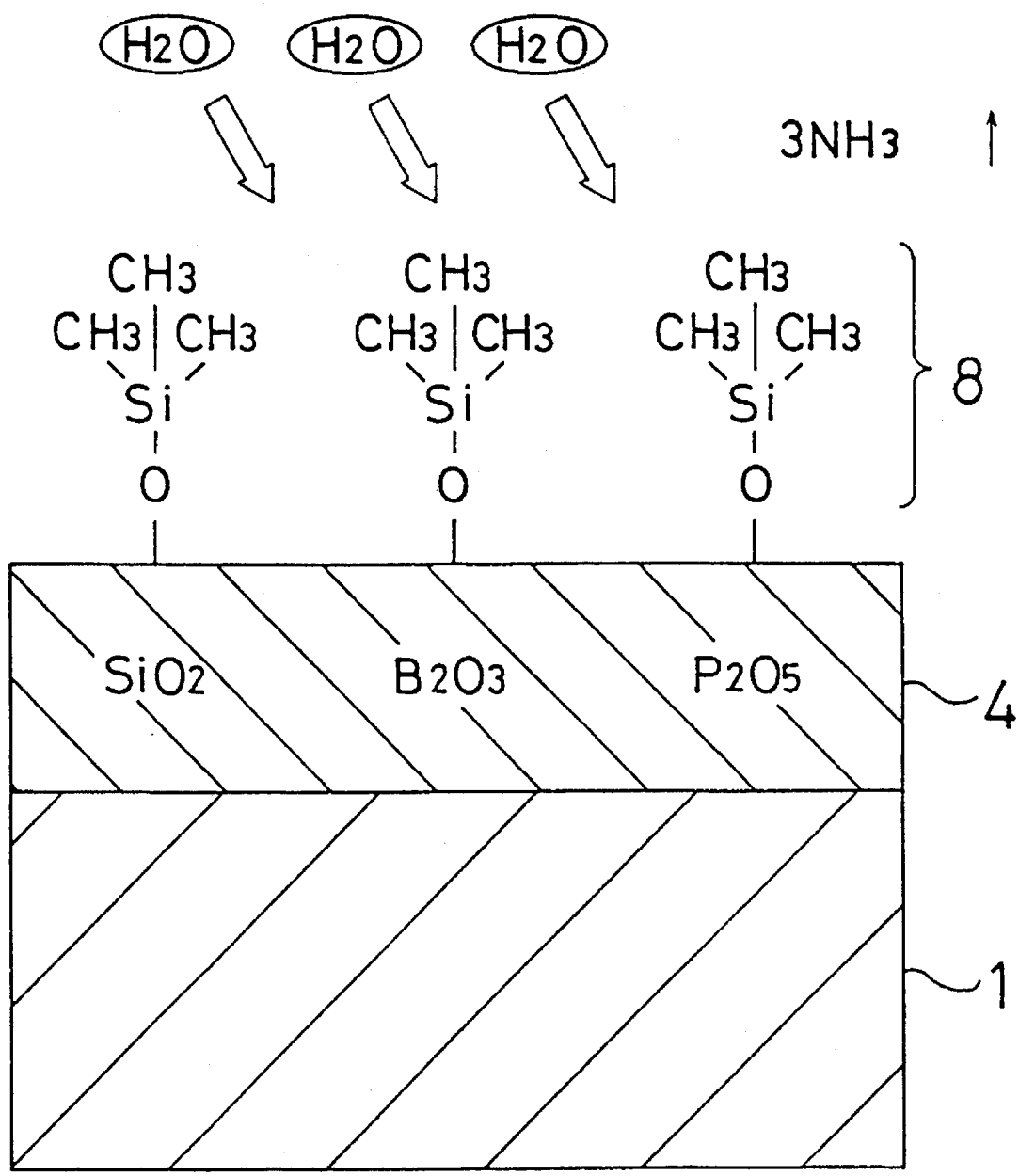

FIG. 1 (a) to (c) show the operating principle of the present invention. When a BPSG layer 4 is formed on a substrate 1, the BPSG layer 4 is covered at the surface thereof with —OH (in the form of Si—OH, B—OH and P—OH), as shown in FIG. 1 (a). Then, when the surface of the BPSG layer 4 is spin-coated with hexamethyldisilazine, as shown in FIG. 1 (b), there is formed, on the surface of the BPSG layer 4, a molecular layer 8 comprising hydrophobic groups in which Si—OH, B—OH and P—OH are silylated by the following silylation reaction formulas:

Silylation Reaction Formulas (↑ shows volatility)

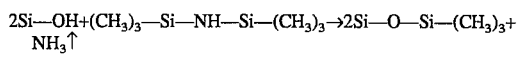

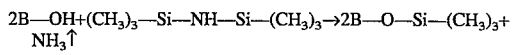

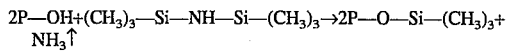

When water molecules reach the surface of the molecular layer 8, the hydrophobic groups of the molecular layer 8 cause the water molecules to be bonded with one another. Accordingly, the water molecules are made in the form of ice blocks, thus increasing the entire volume thereof, as shown in FIG. 1 (c). This prevents water from reaching the surface of the BPSG layer 4. This consequently prevents the BPSG layer 4 from absorbing moisture to restrain precipitates from being generated.

The following will discuss embodiments of the present invention with reference to attached drawings.

Figure 2:
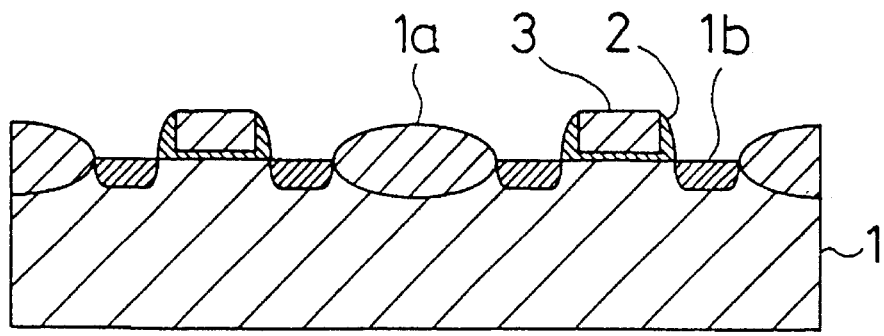
FIG. 2 (a) to (g) are section views illustrating the respective steps of a semiconductor device producing method according to a first embodiment of the present invention.
Figure 2:
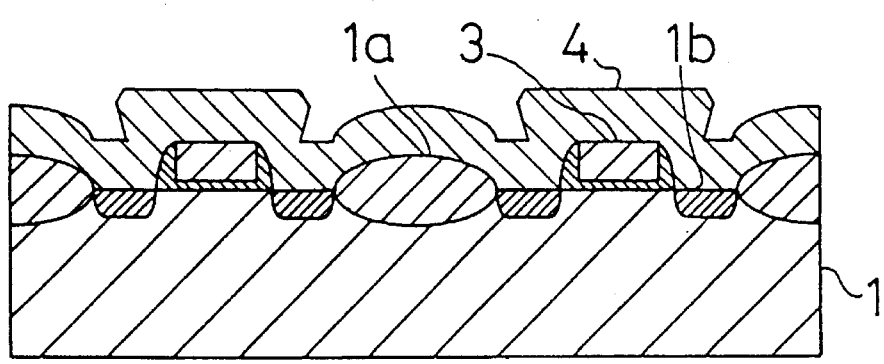
Figure 2:
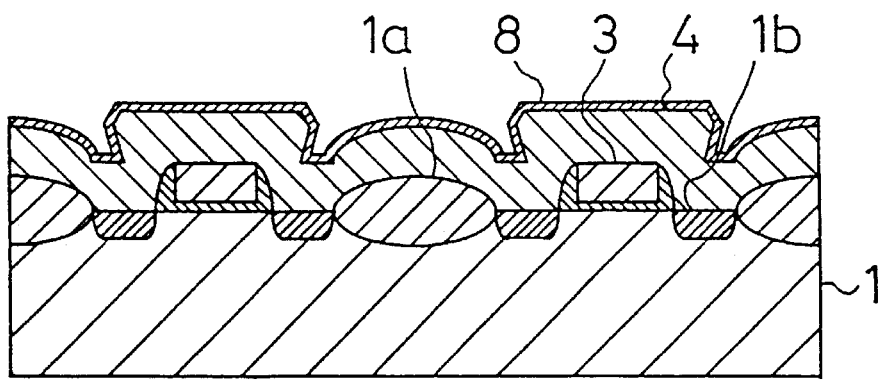
Figure 2:
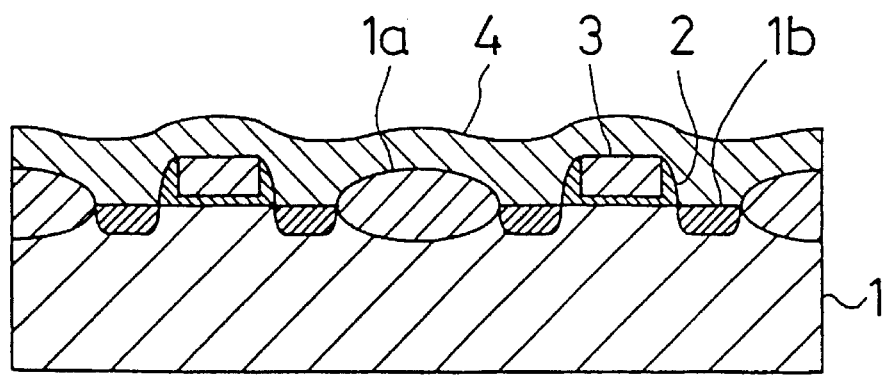
Figure 2:
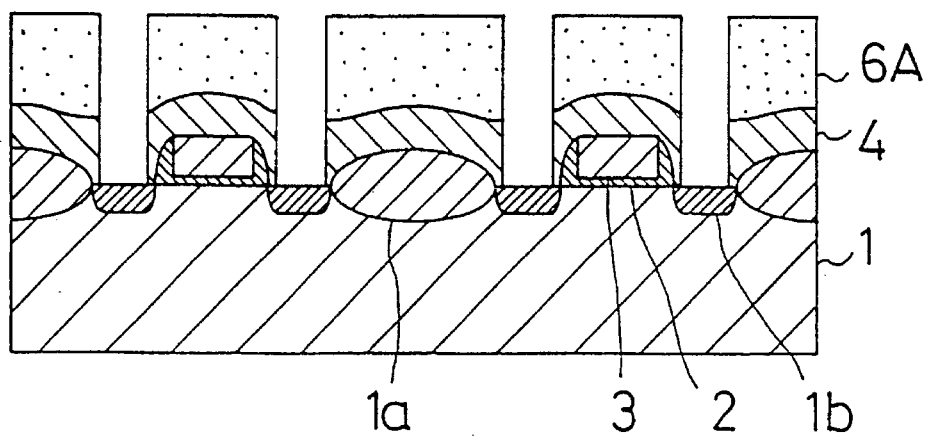
Figure 2:
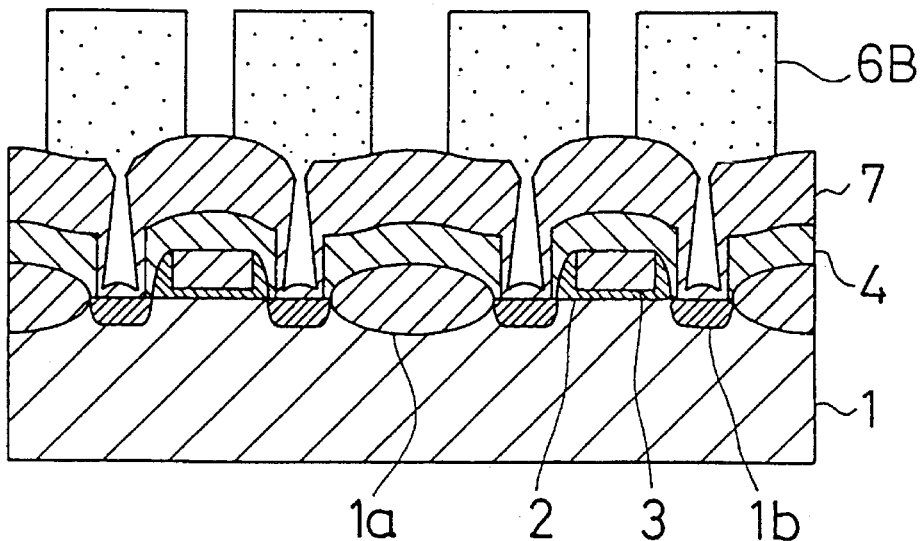
Figure 2:
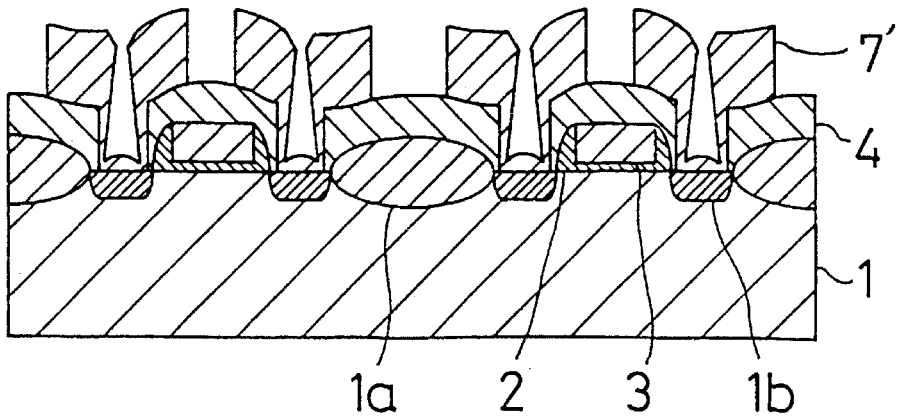

FIG. 2 (a) to (g) are section views schematically illustrating the respective steps of a semiconductor device producing method according to a first embodiment of the present invention.

As shown in FIG. 2 (a), there are formed, on a semiconductor substrate 1 incorporating MOS transistors and the like, (i) LOCOSs 1a for insulating and separating the transistors from one another and (ii) diffusion zones 1b for the sources and drains of the MOS transistors. Then, gate electrodes 3 comprising polysilicon are formed on the surface of the semiconductor substrate 1 through gate oxide layers 2.

As shown in FIG. 2 (b), a BPSG layer 4 containing boron and phosphorus is deposited, in a thickness of 700 nm, on the semiconductor substrate 1 and the gate electrodes 3 according to a normal-pressure CVD method by pyrolysis of gases SiH$_4$, B$_2$H$_6$, PH$_3$ and O$_2$.

Figure 17:
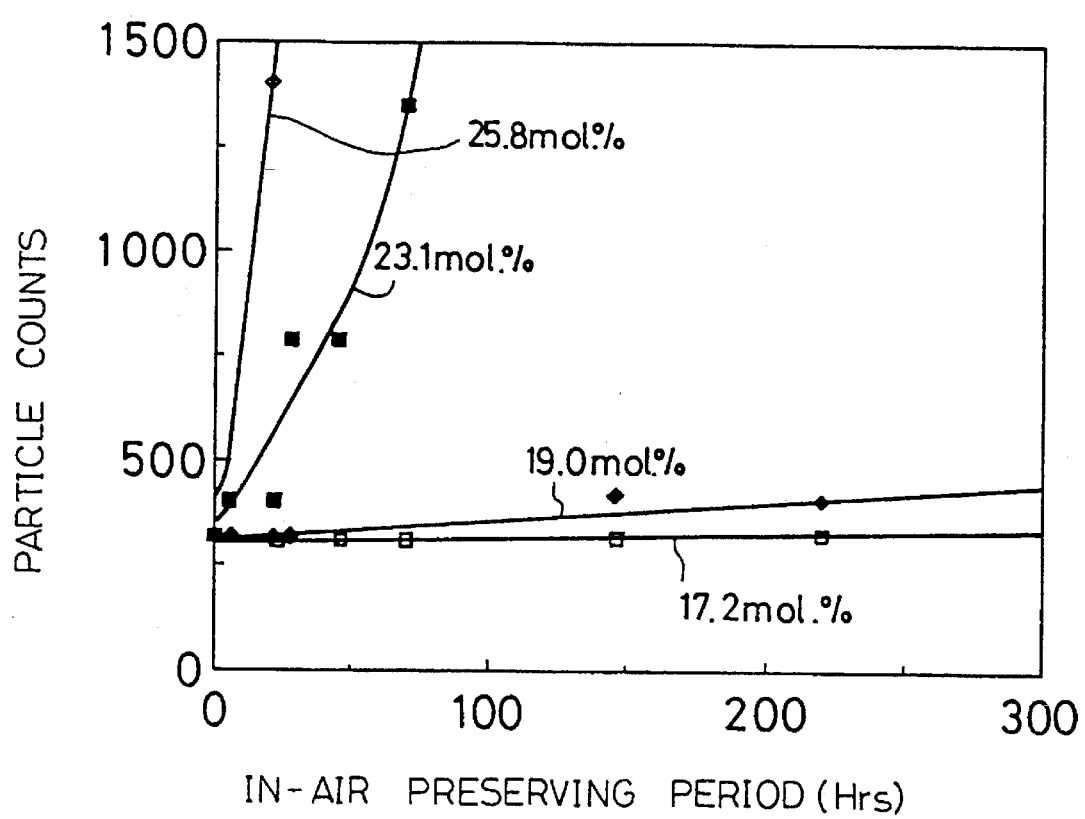
FIG. 17 is a characteristic view showing the relation between the in-air preserving period of time and an increase in particles of a BPSG layer obtained according to the conventional semiconductor device producing method.

Prior to the time when precipitates are generated as shown in FIG. 17, the BPSG layer 4 is spin-coated at the surface thereof with a hydrophobic molecular layer of hexamethyldisilazine. Then, a silylation reaction takes place to form a molecular layer 8 on the surface of the BPSG layer 4. The BPSG layer 4 on which the molecular layer 8 has been formed, is thermally treated to cause the BPSG layer 4 to be flowingly flattened by a glass softening method, as shown in FIG. 2 (d).

As shown in FIG. 2 (e), a resist pattern having a desired shape is formed on the flattened BPSG layer 4 with the use of first photoresists 6A, and the BPSG layer 4 is then etched.

After the first photoresists 6A have been removed, a metallic layer 7 of an aluminium-based alloy serving as an upper electrode is formed on the BPSG layer 4 thus etched, by a sputtering method, as shown in FIG. 2 (f). Then, second photoresists 6B corresponding to a wiring pattern are formed on the surface of the metallic layer 7.

After the metallic layer 7 has been etched, the second photoresists 6B are removed to form a wiring pattern 7' of the metallic layer, as shown in FIG. 2 (g), thus forming a semiconductor device.

In the first embodiment, the molecular layer 8 disappears at the step in FIG. 2 (d). This is because most of atoms comprising the molecular layer 8 are separated or burnt by the heating treatment, or are bonded with oxygen of the BPSG layer 4 to form an oxide layer, or the molecular layer 8 remains in the form of atoms, so that the molecular layer 8 does not exist as it is.

When the BPSG layer 4 is thermally treated, the BPSG layer 4 becomes fine, and Si, B and P comprising the BPSG layer 4 are sufficiently bonded with oxygen. This not only remarkably lowers the BPSG layer 4 in hygroscopic property, but also restrains the occurrence of OH bonds which are hydrophilic and which readily absorb moisture, thus restraining precipitates from being generated. Accordingly, no precipitates are generated on the BPSG layer 4 after the same has been thermally heated. It is therefore not necessary to form a hydrophobic molecular layer on the surface of the BPSG layer 4 after the same has been thermally treated.

To evaluate the present invention, Example of the first embodiment thereof and Comparative Example will be discussed in the following.

As Example of the first embodiment, a mirror-like silicon substrate was used as the semiconductor substrate 1 shown in FIG. 2 (a), and a BPSG layer 4 having an impurity concentration of about 23 mol % was deposited in a thickness of 400 nm, likewise in FIG. 2 (b). Likewise in FIG. 2 (c), a molecular layer 8 was then formed on the BPSG layer 4. By a silylation reaction, there was then formed, on the BPSG layer, a molecular layer comprising hydrophobic groups such as methyl groups, ethyl groups or the like. This molecular layer prevented the surface of the silicon oxide layer from absorbing moisture. Accordingly, there were not formed precipitates such as phosphoric acid, boric acid and the like (which are represented as particles detected by a particle detecting device to be discussed later).

Figure 3:
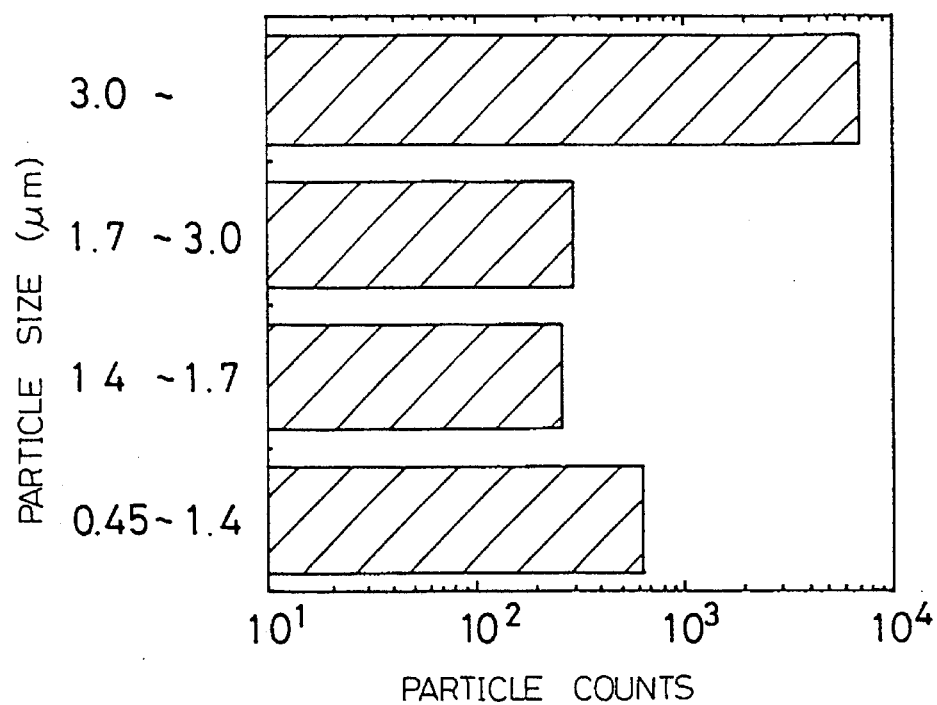
FIG. 3 (a) and (b) show the results of a test which was conducted for evaluating the effect of restraining precipitates from being generated in the practice of the semiconductor device producing method according to the first embodiment, and in which there were measured (i) the number of particles generated in the first embodiment and (ii) the number of particles generated in the practice of a comparative example.
Figure 3:
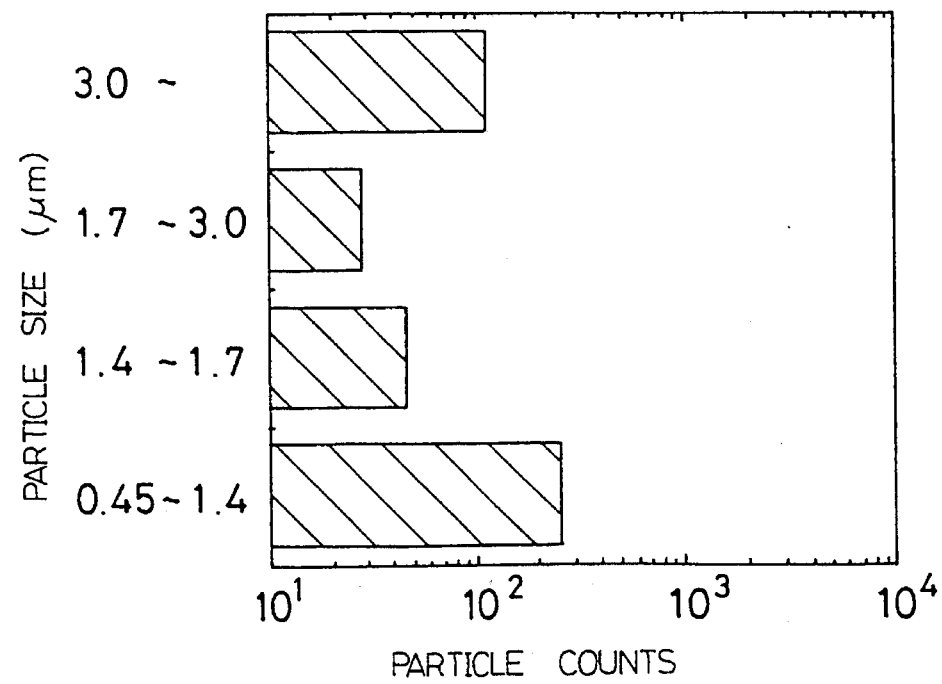

FIG. 3 (a) and (b) show the results of a test in which, with a particle detecting device, precipitates were measured after 199 hours from the deposition of the BPSG layer. FIG. 3 (a) shows, as Comparative Example, the results of a test in which there were measured precipitates generated in the practice of a conventional method. In FIG. 3 (a), the number of precipitates is increased by about 10,000. FIG. 3 (b) shows the results of a test in which there were measured precipitates generated in the practice of Example. In Example, hundreds of particles were generated. This number of particles is substantially equal to the number of particles as measured immediately after the deposition of the BPSG layer 4. It is therefore understood that an increase in the number of particles is remarkably restrained.

Further, there were formed 384K-bit SRAMs each serving as a 0.5 μm-design rule (of which minimum size is equal to 0.5 μm and which is generally equal to the width of a gate electrode ) device, and the yield thereof was evaluated. The results are shown in Table 1. In Example, a very satisfactory yield could be obtained. Conventionally, the yield was about 25% with about 75% of rejects. About ⅓ of the rejects or about 25% thereof was caused by BPSG layers. According to the present invention, however, there were substantially no rejects resulting from BPSG layers. Therefore, the entire yield was improved to about 50%.

TABLE 1

| Method | Yield |
| --- | --- |
| Conventional Method | abt. 25% |
| Present Invention | abt. 50% |

As discussed in the foregoing, the method according to the first embodiment of the present invention comprises: a first step of forming, on a substrate such as a semiconductor substrate or the like, a silicon oxide layer containing at least one of boron, phosphorus and arsenic; a second step of supplying a material containing hydrophobic groups bonded with Si, onto the silicon oxide layer formed at the first step, so that the hydrophobic groups bonded with Si are bonded with oxygen of the silicon oxide layer, thus forming, on the silicon oxide layer, a molecular layer comprising molecules having the hydrophobic groups bonded with Si, the hydrophobic groups bonded with the oxygen of the silicon oxide layer preventing moisture from entering the silicon oxide layer; and a third step of forming a wiring layer, directly or through an insulating layer, on the silicon oxide layer on which the molecular layer has been formed at the second step. In particular, the molecular layer comprising molecules having the hydrophobic groups is formed on the silicon oxide layer at the second step. This prevents the silicon oxide layer from absorbing moisture. This consequently prevents precipitates from being generated.

The following will schematically discuss the respective steps of a semiconductor device producing method according to a second embodiment of the present invention. The basic flow of the steps of the semiconductor device producing method of the second embodiment is similar to that in the first embodiment. The second embodiment differs from the first embodiment in that the BPSG layer 4 shown in FIG. 2 (b) is formed by a normal-pressure CVD method using tetraethoxysilane ($Si(OC_2H_5)_4$), triethylphosphate ($P(OC_2H_5)_3$), trimethylborate ($B(OCH_3)_3$) and ozone gas. Hereinafter, the BPSG layer formed by the method above-mentioned will be referred to as $O_3$/TEOS based BPSG layer. This method is very good in view of the properties of coating level-differences of the $O_3$/TEOS based BPSG layer. Accordingly, this method can also be used for coating concaved/convexed portions of the surface of a semiconductor substrate for which fineness is strongly required, e.g., a semiconductor substrate for a 64-MDRAM or the like.

Figure 4:
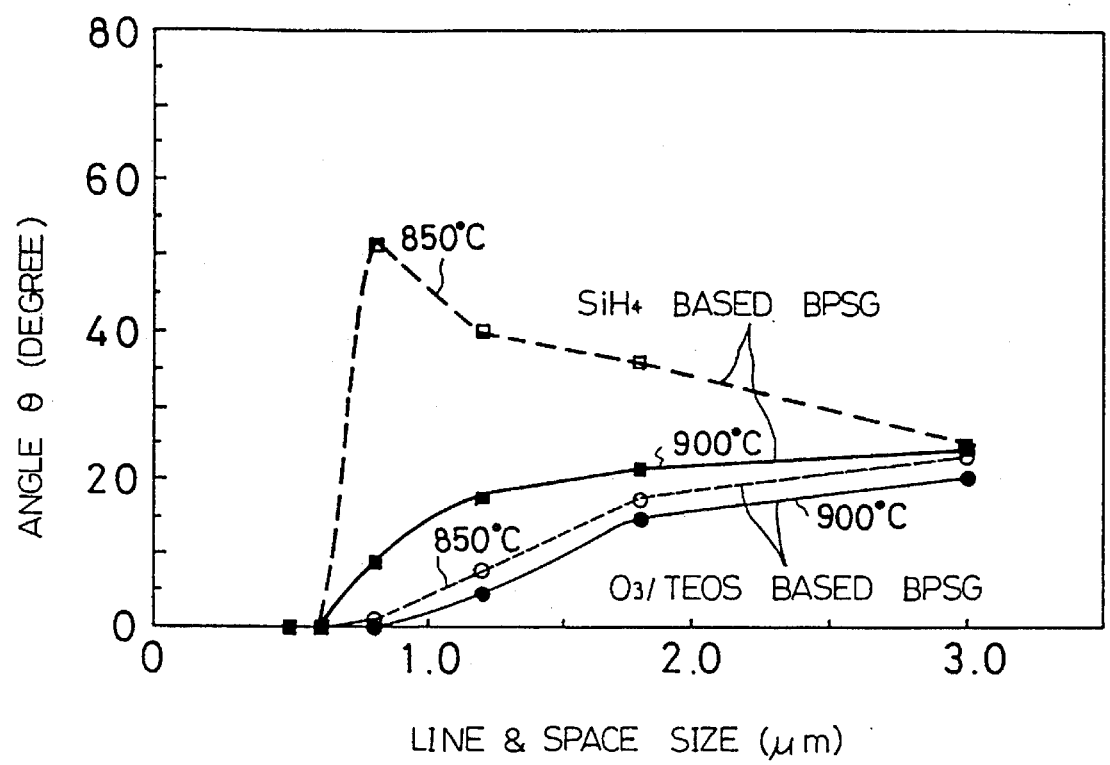
FIG. 4 is a view illustrating how BPSG layers formed with the use of silane gas according to the first embodiment of the present invention, and BPSG layers formed with the use of ozone/TEOS gas according to a second embodiment of the present invention, are flattened after subjected to glass flow planarization.
Figure 15:
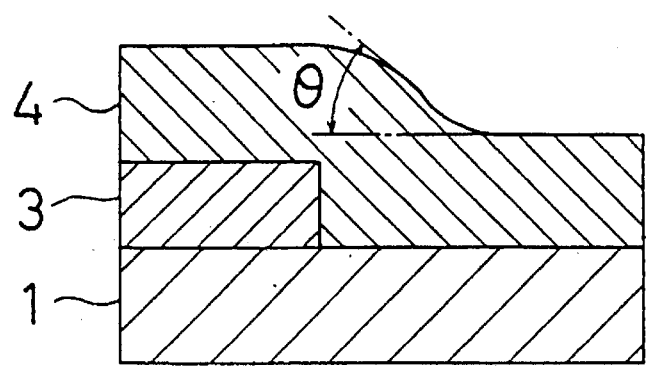
FIG. 15 is a view showing a flattened angle for illustrating the flatnesses of a BPSG layer after subjected to glass flow planarization according to the conventional semiconductor device producing method.
Figure 16:
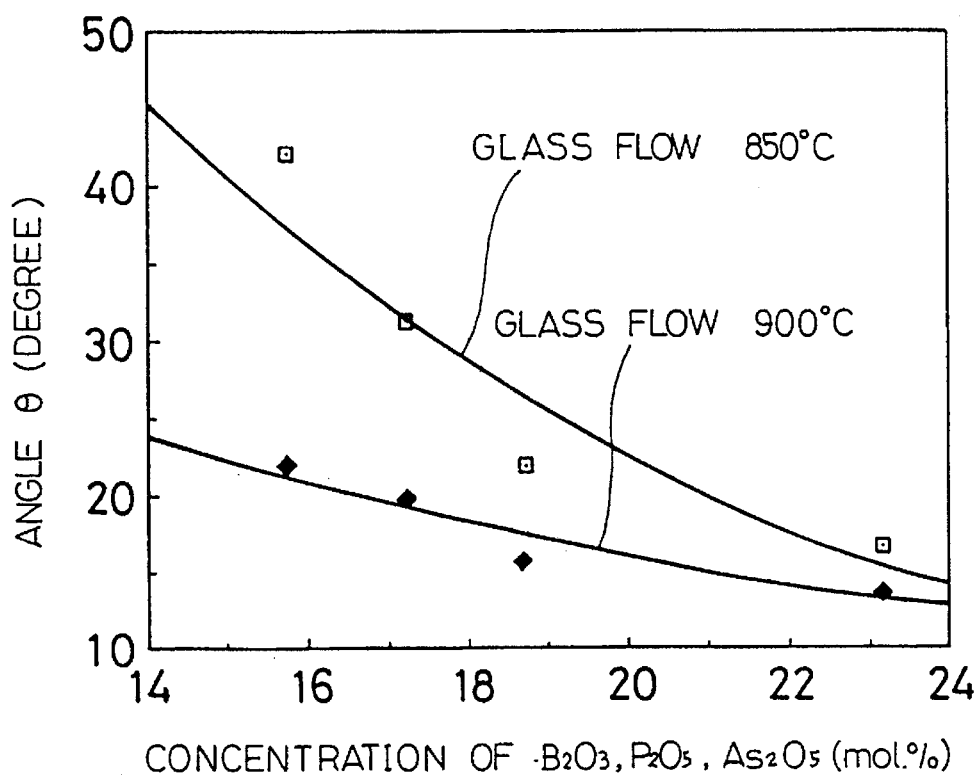
FIG. 16 is a view illustrating the flattened conditions of BPSG layers respectively subjected to glass flow planarization at 850° C. and 900° C. according to the conventional semiconductor device producing method.

FIG. 4 shows the comparison of flattened angles θ obtained according to the first embodiment with those obtained according to the second embodiment. $SiH_4$ based BPSG layers each having a thickness of 400 nm according to the first embodiment, and $O_3$/TEOS based BPSG layers each having a thickness of 400 nm according to the second embodiment, were respectively deposited on line-and-space patterns of polysilicon electrodes. The impurity concentration of each of the BPSG layers was set to 16.4 mol %. The BPSG layers according to the first embodiment were respectively subjected to glass flow planarization at 900° C. in a nitrogen atmosphere for 60 minutes and to glass flow planarization at 850° C. in a pyrogenic atmosphere for 60 minutees. Also, the BPSG layers according to the second embodiment were respectively subjected to glass flow planarization at 900° C. in a nitrogen atmosphere for 60 minutes and to glass flow planarization at 850° C. in a pyrogenic atmosphere for 60 minutes. With a scanning electron microscope, the section of each of the BPSG layers similar to the section shown in FIG. 15 was observed and checked for flattened angle θ serving as an index which represents the flatness obtained by the glass flow planarization. FIG. 4 shows the results of the observation above-mentioned. In both glass flow planarizations, the $O_3$/TEOS based BPSG layers are superior in planarizations to the $SiH_4$ based BPSG layers.

Figure 5:
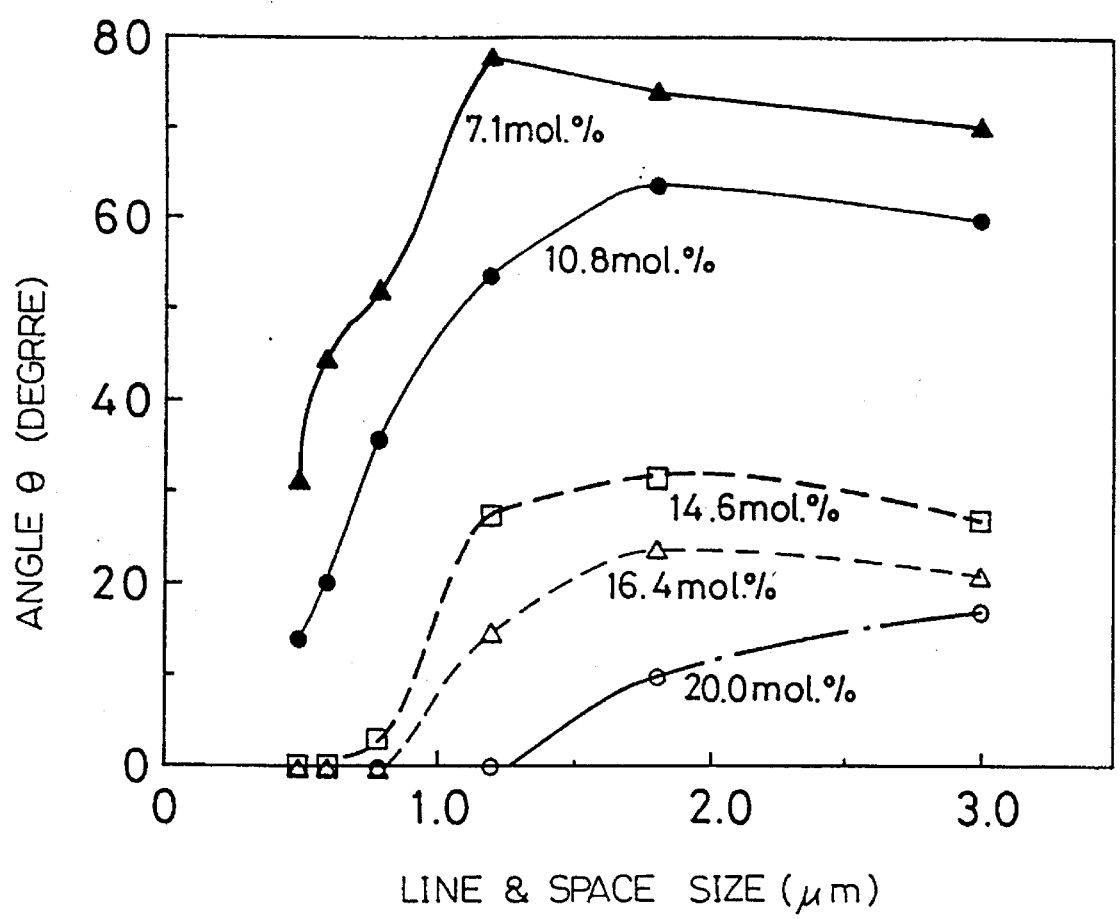
FIG. 5 is a view illustrating how BPSG layers obtained with the use of ozone/TEOS gas according to the second embodiment of the present invention, are flattened with respect to a variety of wiring patterns under the BPSG layers after subjected to glass flow planarization.

FIG. 5 shows the results of comparison of flattened angles θ with respect to impurity concentrations in BPSG layers obtained by the method according to the second embodiment. $O_3$/TEOS based BPSG layers 4 each having a thickness of 700 nm were formed on polysilicon patterns each having a thickness of 450 nm, and then subjected to glass flow planarization in a pyrogenic atmosphere at 850° C. for 60 minutes. It is understood that the method of the second embodiment is superior in flatness to the method of the first embodiment. It is understood from FIG. 5 that an impurity concentration of not less than 16 mol % is required in order to stably obtain a flattened angle θ of not greater than 30° after glass flow planarization. Further, it is required to further increase the impurity concentration for the glass flow planarization in a $N_2$ atmosphere.

Figure 6A:
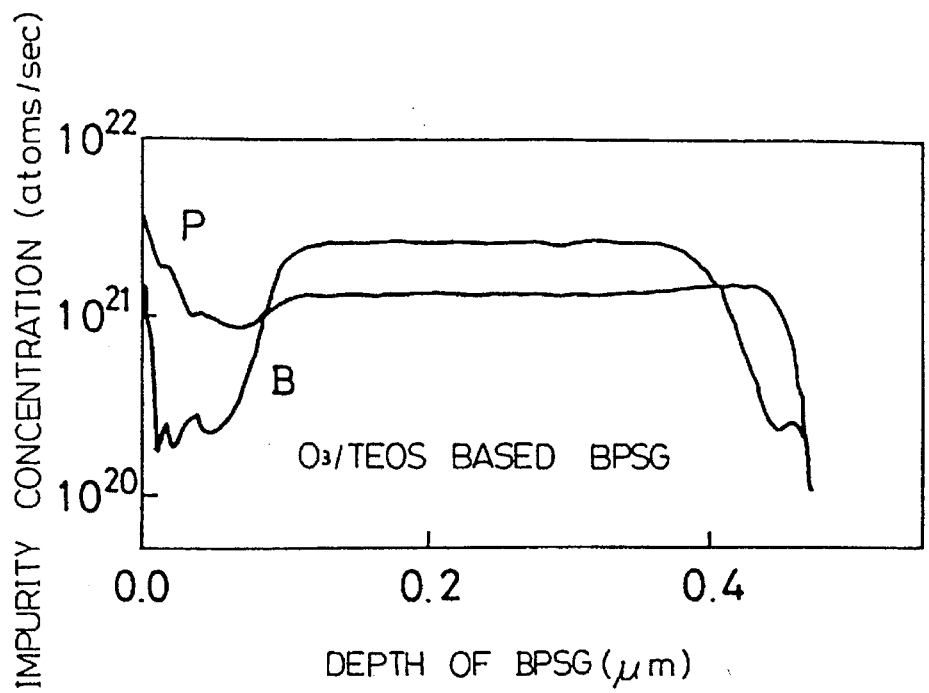
FIG. 6(a) and (b) shows the distributions of B and P in the depth direction of a BPSG layer obtained with the use of silane gas according to the first embodiment of the present invention and a BPSG layer obtained with the use of ozone/TEOS gas according to the second embodiment of the present invention, the distributions being obtained by SIMS analysis.
Figure 6B:
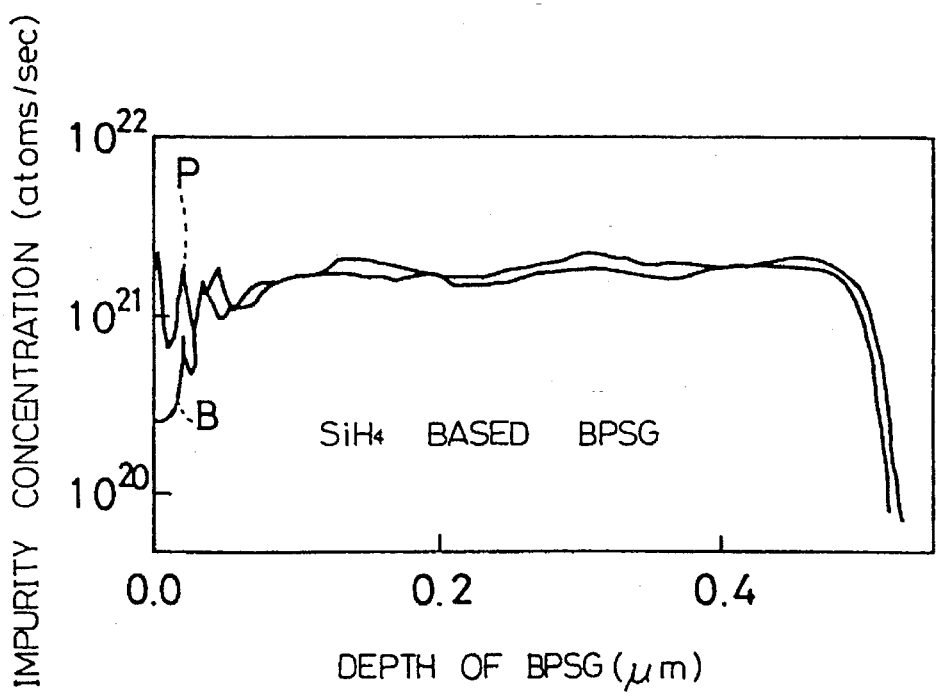

FIG. 6 shows the results of analysis on the secondary ion mass in the depth direction of each of the BPSG layer 4 obtained with the use, as the row material gas, of $SiH_4$ according to the method of the first embodiment and of the BPSG layer 4 obtained with the use, as the row material gas, of $O_3$/TEOS according to the the method of the second embodiment. The $O_3$/TEOS based BPSG layer 4 is considerably higher in hygroscopic property than the $SiH_4$ based BPSG layer 4. In the $O_3$/TEOS based BPSG layer 4, the impurity concentrations were constant in the depth direction, but there were observed an increase in P-concentration and an decrease in B-concentration in the vicinity of the surfaces of the layer 4. This shows a state where phosphorus is about to precipitate in the form of metaphosphate on the surfaces because of the hygroscopic property of P. On the other hand, in the $SiH_4$ based BPSG layer 4, both B and P vary in great amplitude in the vicinity of the surfaces. This results from an influence of the remarkably uneven surfaces of the BPSG layer 4, and a great influence of moisture absorption is not observed.

Figure 7:
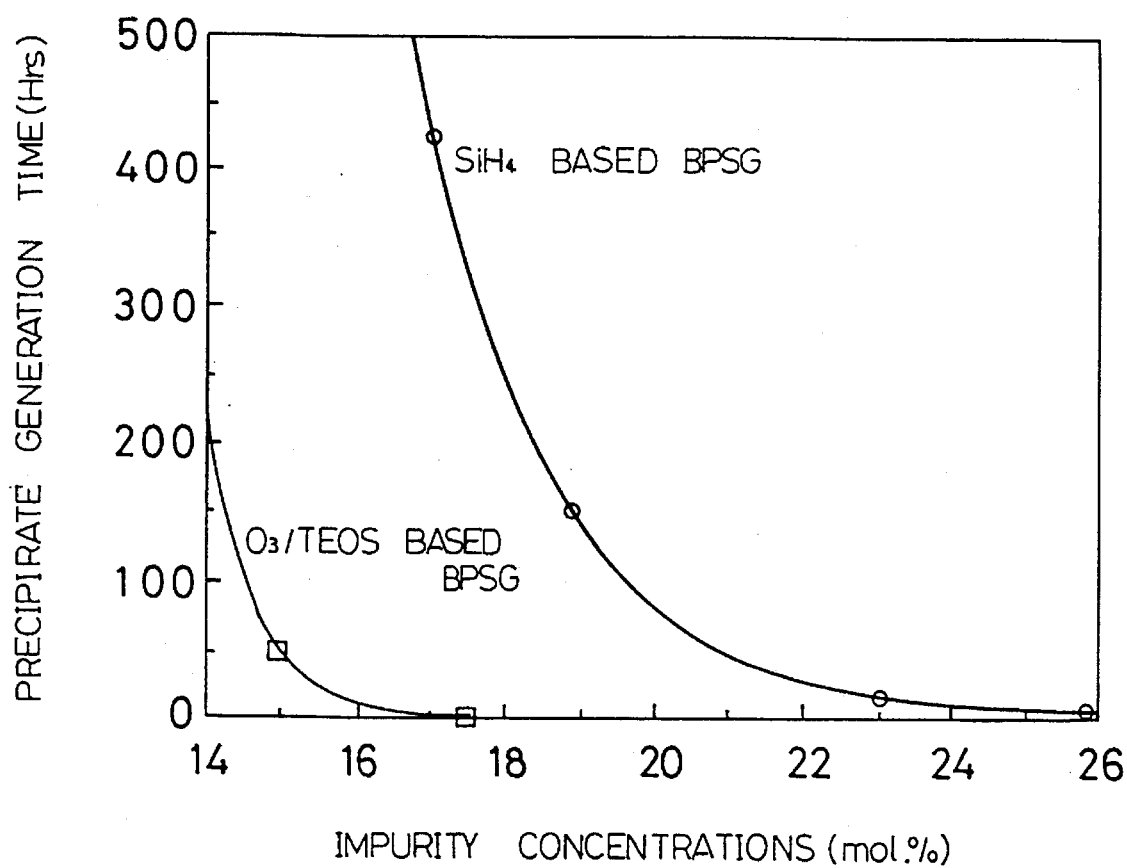
FIG. 7 shows the periods of time before precipitates are generated on a BPSG layer obtained with the use of silane gas according to the first embodiment of the present invention and on a BPSG layer obtained with the use of ozone/TEOS gas according to the second embodiment of the present invention.

FIG. 7 shows variations, with respect to a variety of concentrations, of a period of time during which the number of dusts immediately after deposition is doubled by an increase in precipitates in each of the $SiH_4$ based BPSG layer 4 and the $O_3$/TEOS based BPSG layer 4. Precipitates are generated due to moisture absorption, but it is well understood that, in the $O_3$/TEOS based BPSG layer 4, precipitates are remarkably increased even in a low concentration.

Figure 8:
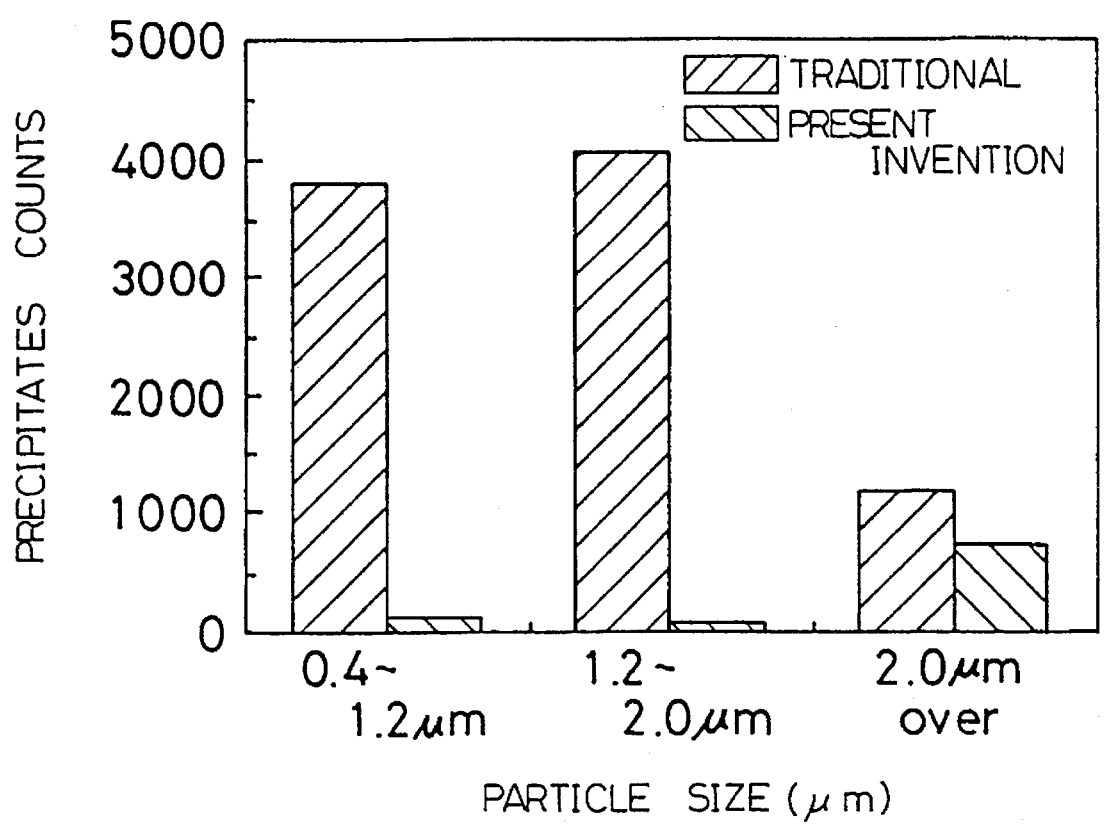
FIG. 8 shows the results of a test which was conducted for evaluating the effect of restraining precipitates from being generated in the practice of the semiconductor device producing method according to the second embodiment, and in which there were measured (i) the number of particles generated in the practice of the second embodiment and (ii) the number of particles generated in the practice of a comparative example.
Figure 9A:
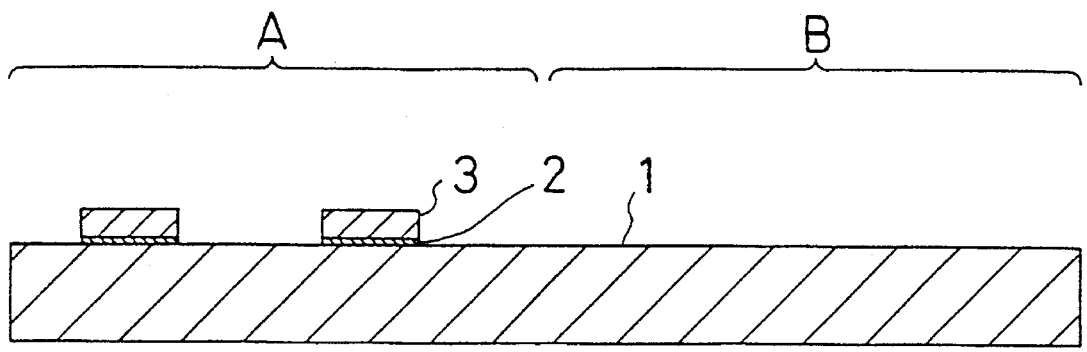
FIG. 9 (a) to (f) are section views of the respective steps of the semiconductor device producing method according to each of the first and second embodiments of the present invention.
Figure 9B:
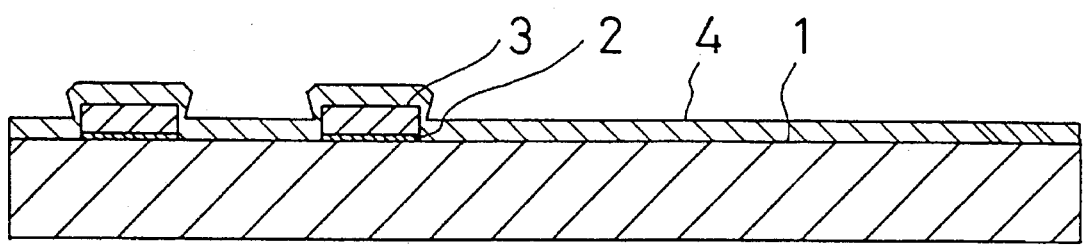
Figure 9C:
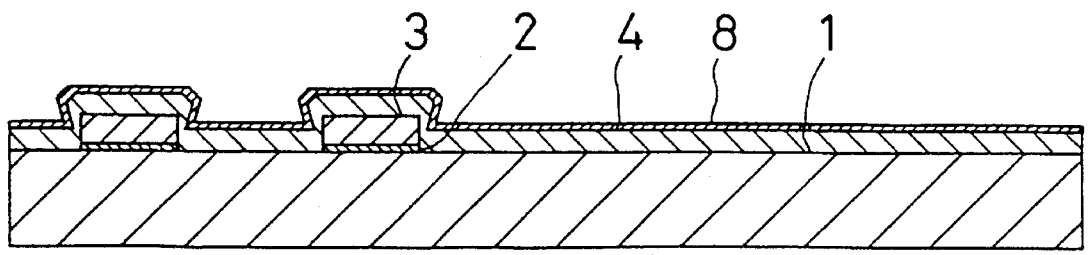
Figure 9D:
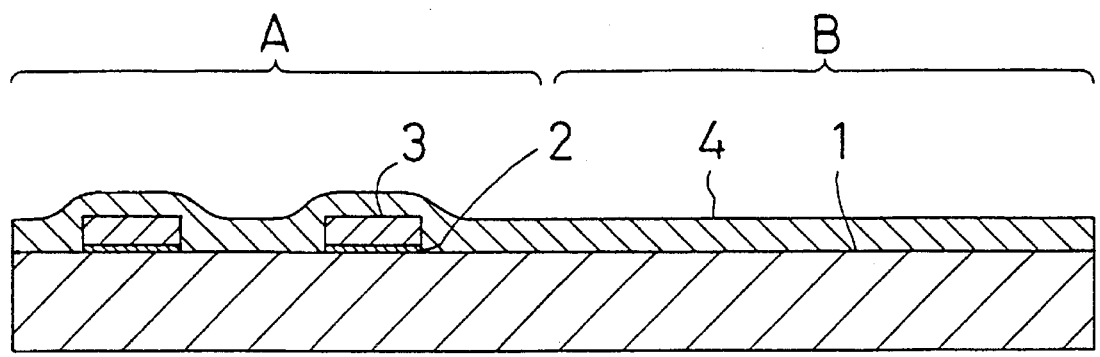
Figure 9E:
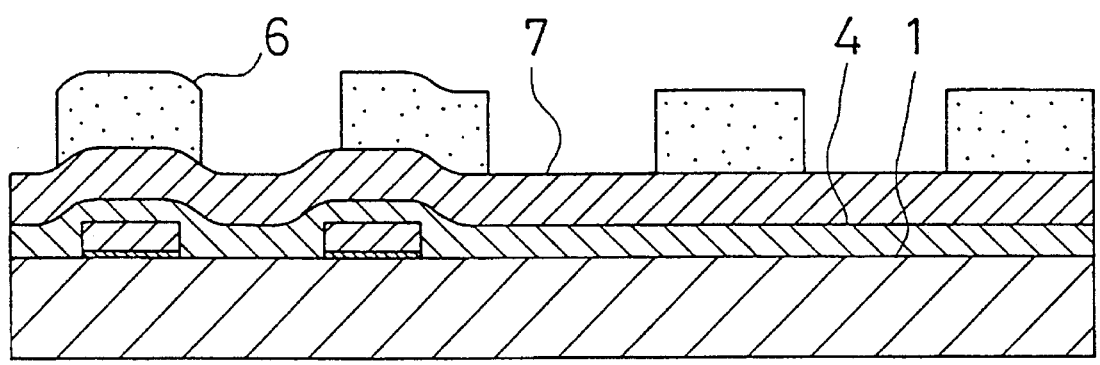
Figure 9F:
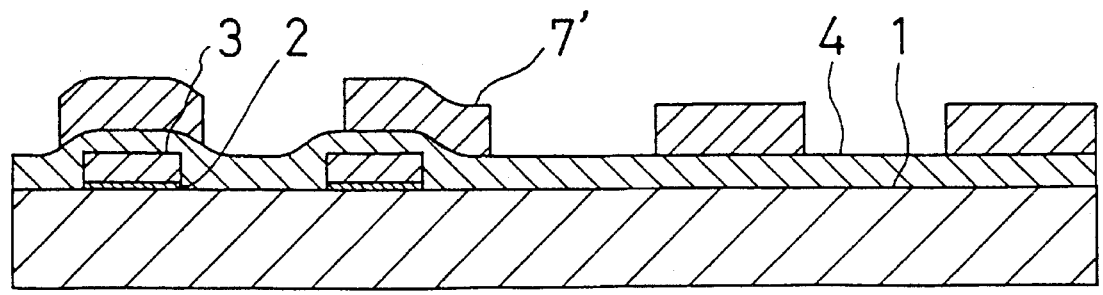

FIG. 8 shows the results of a test conducted on (i) a $O_3$/TEOS based BPSG layer 4 presenting an impurity concentration of about 16 mol % which had been deposited on a mirror-like silicon substrate 1 and on which a hydrophobic molecular layer 8 according to the present invention had been formed within 30 minutes after the deposition, and (ii) a BPSG layer having no molecular layer 8, serving as Comparative Example. As to each of the BPSG layers, there was measured an increase in precipitates generated after the passage of four hours from the deposition. From FIG. 8, it is understood that substantially no precipitates were generated on the layer obtained according to the present invention. In FIG. 8, most of precipitates of which particle sizes are not less than 2.0 μm, are those generated from producing apparatus. Accordingly, improvements as to such precipitates were limited to the extent as shown in FIG. 8.

As discussed in the foregoing, since the $O_3$/TEOS based BPSG layer is used, the method of the second embodiment is improved, with the same impurity concentration, in flatness obtained by glass flow planarization as compared with the BPSG layer 4 of the first embodiment. Further, the upper metallic wirings can be prevented from being disconnected due to precipitates generated in a BPSG layer of which impurity concentration is low. FIG. 9 (a) to (f) show the foregoing.

As shown in FIG. 9 (a), gate electrodes 3 comprising polysilicon were formed on semiconductor substrates 1 through gate oxide layers 2. As shown in FIG. 9 (b), each BPSG layer 4 was formed on the semiconductor substrate 1 and the gate electrodes 3. Here, each of the $SiH_4$ based BPSG layer 4 according to the first embodiment, and the $O_3$/TEOS based BPSG layer 4 according to the second embodiment, was deposited in a thickness of 700 nm with the impurity concentration of about 16 mol %.

As shown in FIG. 9 (c), each hydrophobic molecular layer 8 according to the present invention was formed on each BPSG layer 4. As shown in FIG. 9 (d), each BPSG layer 4 was then thermally treated, causing the glass therein to be softened so that each BPSG layer 4 was flowingly flattened. In FIG. 9 (d), each molecular layer 8 disappeared. This was because most of atoms comprising each molecular layer 8 were separated or burnt by heating treatment, or were bonded with oxygen of the BPSG layer 4 to form an oxide layer, or each molecular layer 8 remained in the form of atoms, so that each molecular layer 8 did not exist as it was.

As shown in FIG. 9 (e), a metallic layer 7 of an aluminium-based alloy serving as an upper electrode was formed on each BPSG layer 4 by a sputtering method. On each BPSG layer 4, photoresists 6 were then formed to form a wiring pattern in which each wire had a width of 0.6 μm and in which the distance between adjacent wires was 0.6 μm. As shown in FIG. 9 (f), each metallic layer 7 was etched and the photoresists 6 were then removed to form each wiring pattern 7'.

The following description will discuss an evaluation test conducted for clarifying the flattening effect of each BPSG layer 4 thus prepared. Each wiring pattern 7' was also formed on a portion (B) (See FIG. 9 (a) and (d)) of each semiconductor substrate 1 on which the gate electrodes 3 of polysilicon were not formed, as well as a portion (A) on the semiconductor substrate 1 on which the gate electrodes 3 were formed. That is, as shown in FIG. 9 (a) to (f), the BPSG layers 4 and the molecular layers 8 were formed, the BPSG layers 4 were flattened, the metallic layers 7 were formed and the wiring patterns 7' were etched.

Thus, each wiring pattern 7' was simultaneously formed on the portion (A) on the gate electrodes 3 and the flat portion (B) on the same semiconductor substrate 1, so that variations of the machining sizes of wirings each having a width of 0.6 μm could be made constant.

Figure 10:
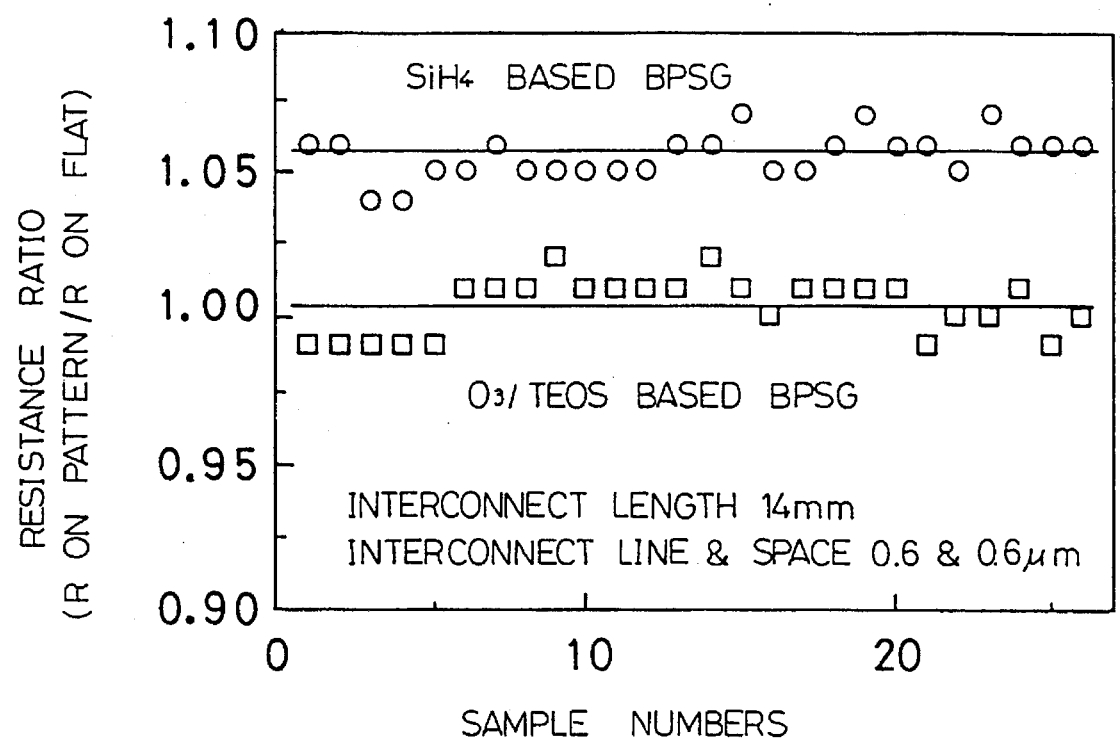
FIG. 10 is a characteristic view illustrating resistance ratios which represent the flattening effects produced by the semiconductor device producing methods according to the first and second embodiments of the present invention.

FIG. 10 shows a distribution of values obtained by dividing the wiring resistances of parts of the wiring pattern 7' on the gate electrodes 3, by the wiring resistances of flat parts of the wiring pattern 7', the wiring pattern having an entire wire length of 14 mm. The flatness can be judged whether or not the quotients are near to 1. As apparent from FIG. 10, the quotients of the $O_3$/TEOS based BPSG layer 4 of the second embodiment are smaller than the quotients of the $SiH_4$ based BPSG layer of the first embodiment, and are substantially equal to 1. This shows that the $O_3$/TEOS based BPSG layer of the second embodiment is excellent in flatness. The yield of each of the BPSG layers 4 of the first and second embodiments was 100%. This shows that no influence of precipitates is exerted.

Figure 11:
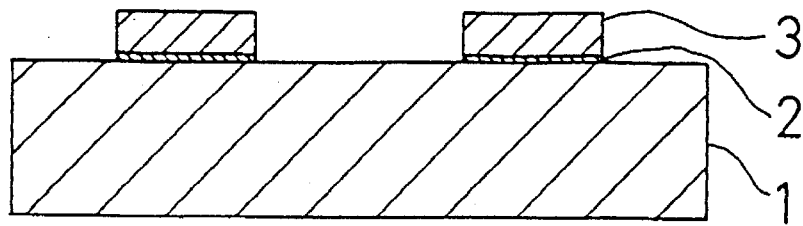
FIG. 11 (a) to (g) are section views of the respective steps of the semiconductor device producing method according to a third embodiment of the present invention.
Figure 11:
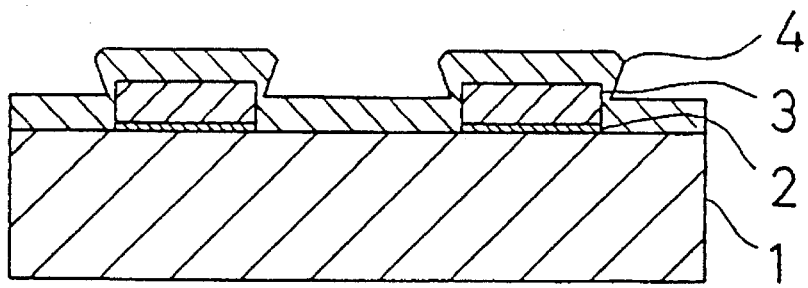
Figure 11:
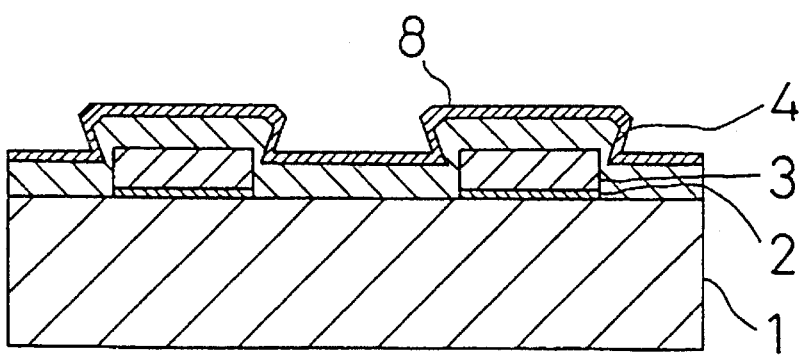
Figure 11:
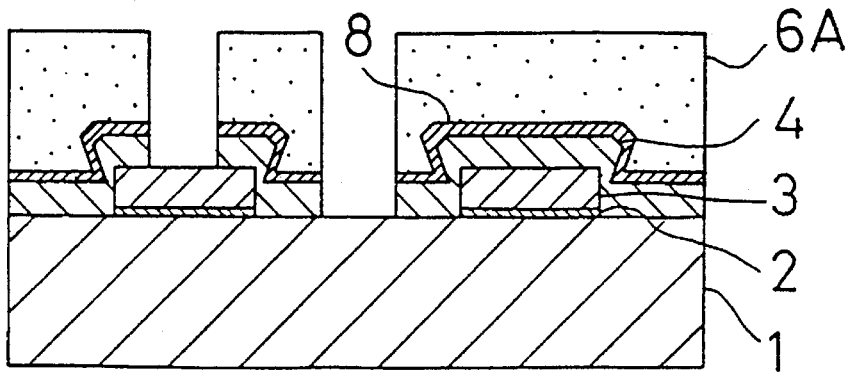
Figure 11:
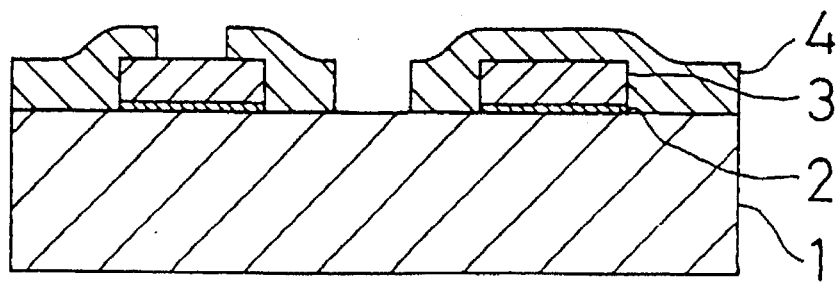
Figure 11:
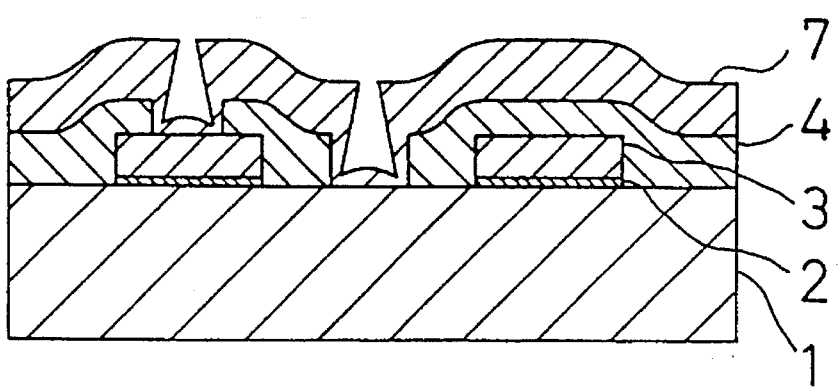
Figure 11:
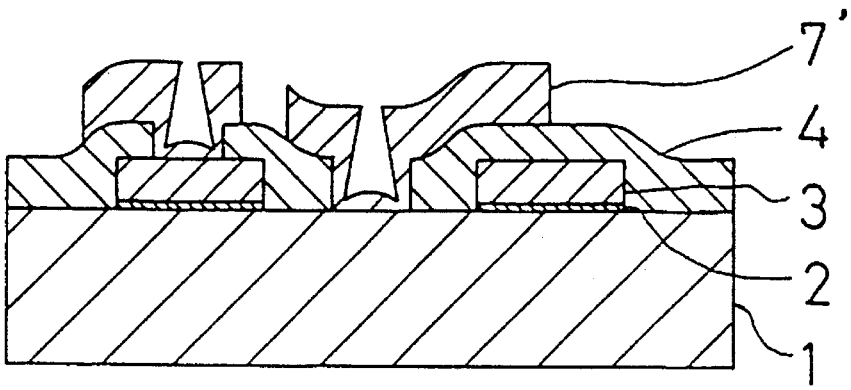

FIG. 11 (a) to (g) are schematic section views for illustrating the respective steps of a semiconductor device producing method according to a third embodiment of the present invention.

As shown in FIG. 11 (a), gate electrodes 3 are formed on a semiconductor substrate 1 through gate oxide layers 2. As shown in FIG. 11 (b), a BPSG layer 4 is formed on the semiconductor substrate 1 and the gate electrodes 3.

As shown in FIG. 11 (c), a hydrophobic molecular layer 8 is formed on the BPSG layer 4 to prevent precipitates from being generated. As shown in FIG. 11 (d), first photoresists 6A are formed in a desired resist pattern on the molecular layer 8, then the BPSG layer 4 is etched.

As shown in FIG. 11 (e), the first photoresists 6A are removed and the BPSG layer 4 is then subjected to glass flow planarization to reduce the level differences of the BPSG layer 4. Then, a thin oxide layer formed at the time of the glass flow planarization is etched with hydrogen fluoride.

As shown in FIG. 11 (f), a metallic layer 7 is formed on the BPSG layer 4, and second photoresists (not shown) are formed in a desired resist pattern on the metallic layer 7. As shown in FIG. 11 (g), the metallic layer 7 is etched and the second photoresists are then removed to form a wiring pattern 7' of the layer, thus forming a semiconductor device.

The third embodiment is characterized in that the BPSG layer 4 is so etched as to be made in a desired shape after the BPSG layer 4 has been deposited and before the BPSG layer 4 is subjected to the glass flow planarization, so that the etching depth of the BPSG layer 4 is constant regardless of the shape of the substrate. This enables the etching to be precisely controlled.

Figure 12:
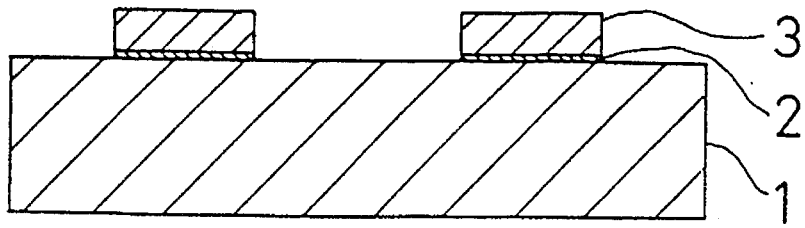
FIG. 12 (a) to (h) are section views of the respective steps of the semiconductor device producing method according to a fourth embodiment of the present invention.
Figure 12:
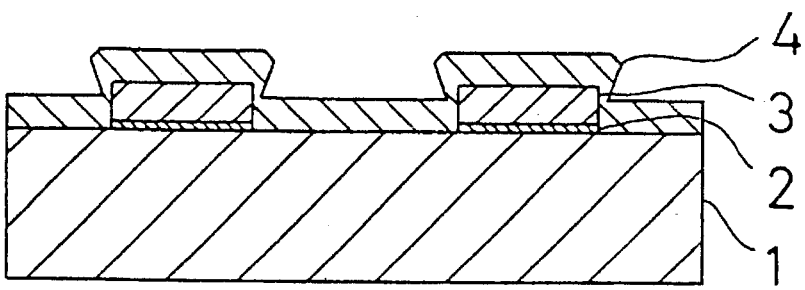
Figure 12:
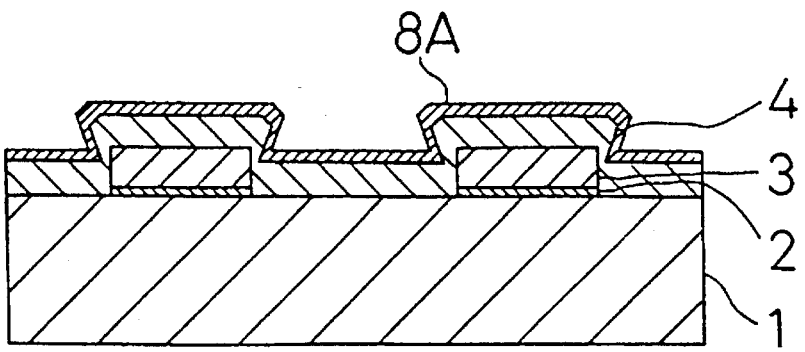
Figure 12:
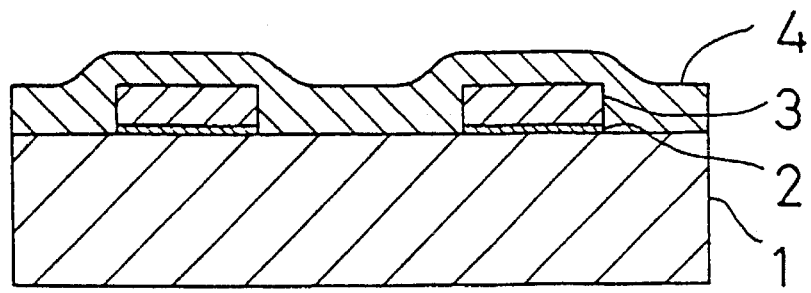
Figure 12:
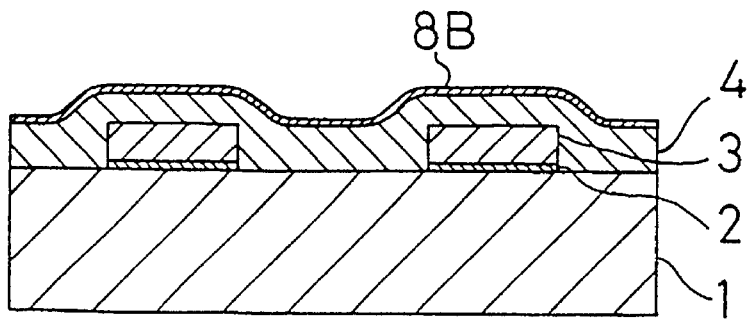
Figure 12:
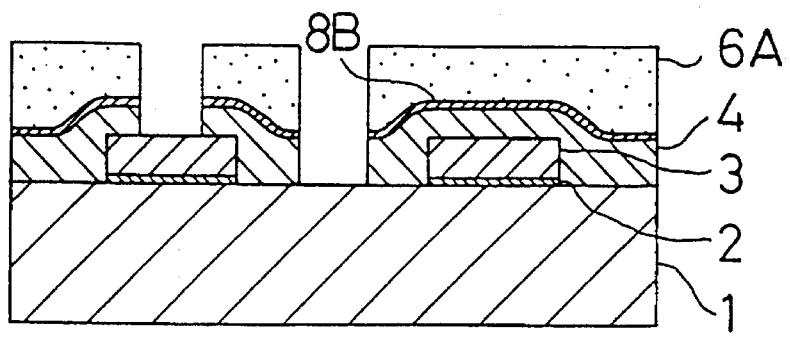
Figure 12:
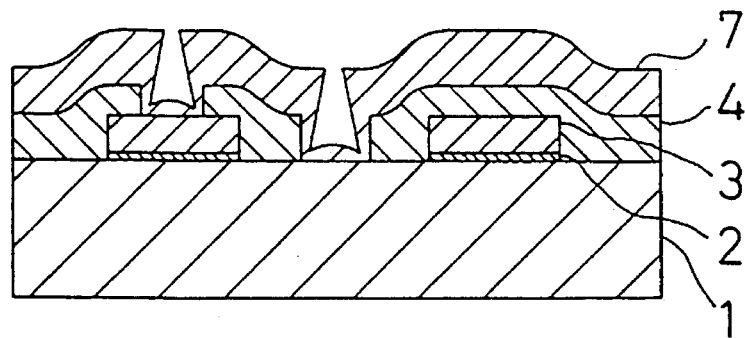
Figure 12:
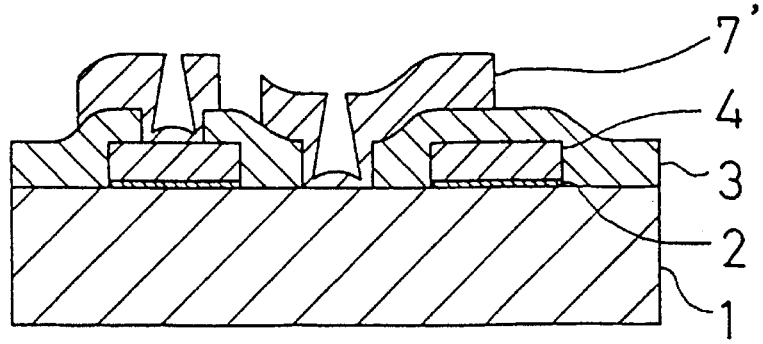
Figure 13:
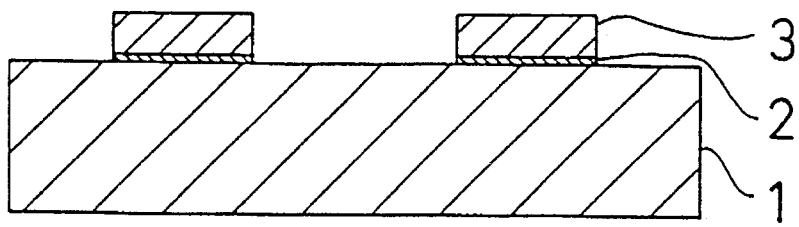
FIG. 13 (a) to (f) are section views of the respective steps of a conventional semiconductor device producing method.
Figure 13:
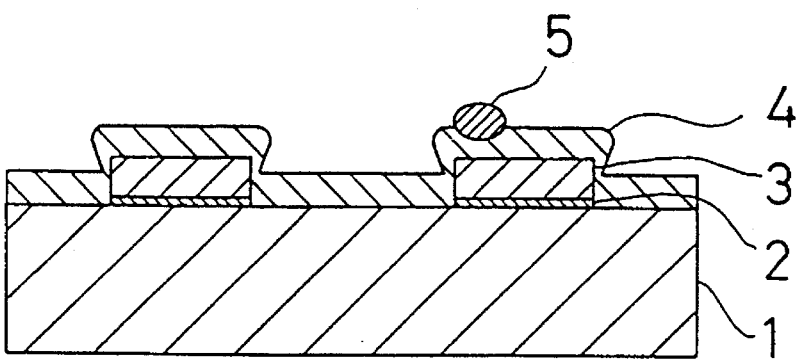
Figure 13:
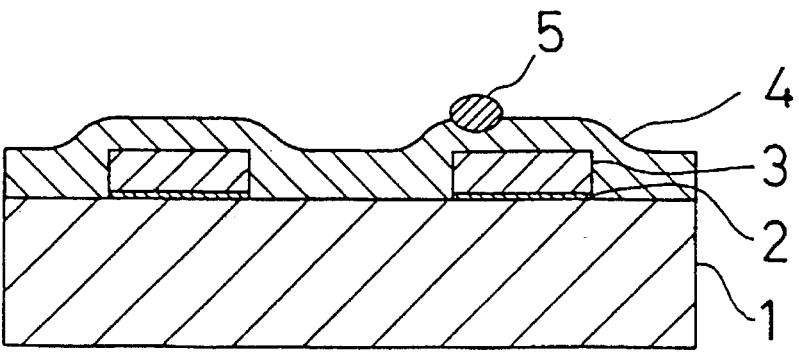
Figure 13:
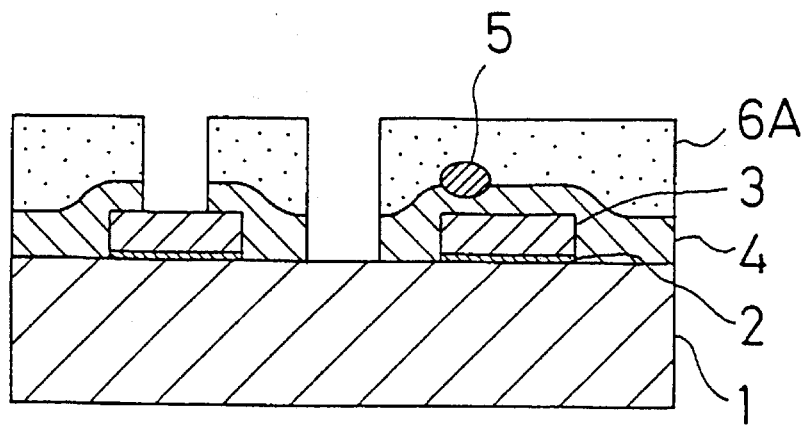
Figure 13:
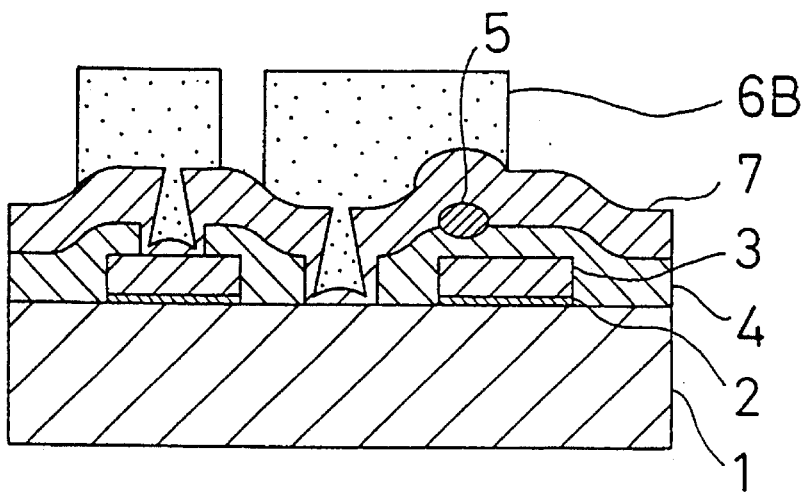
Figure 13:
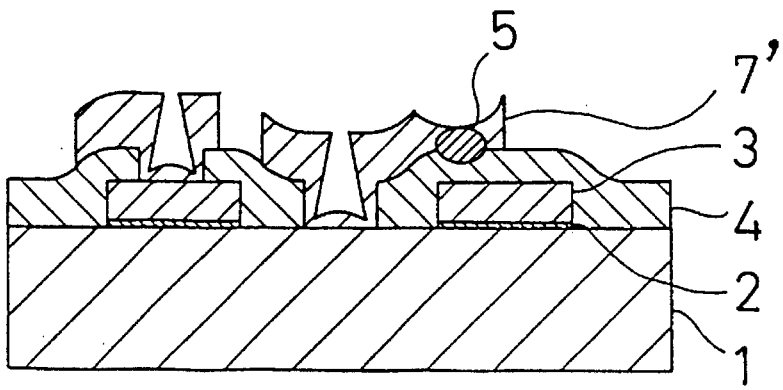
Figure 14:
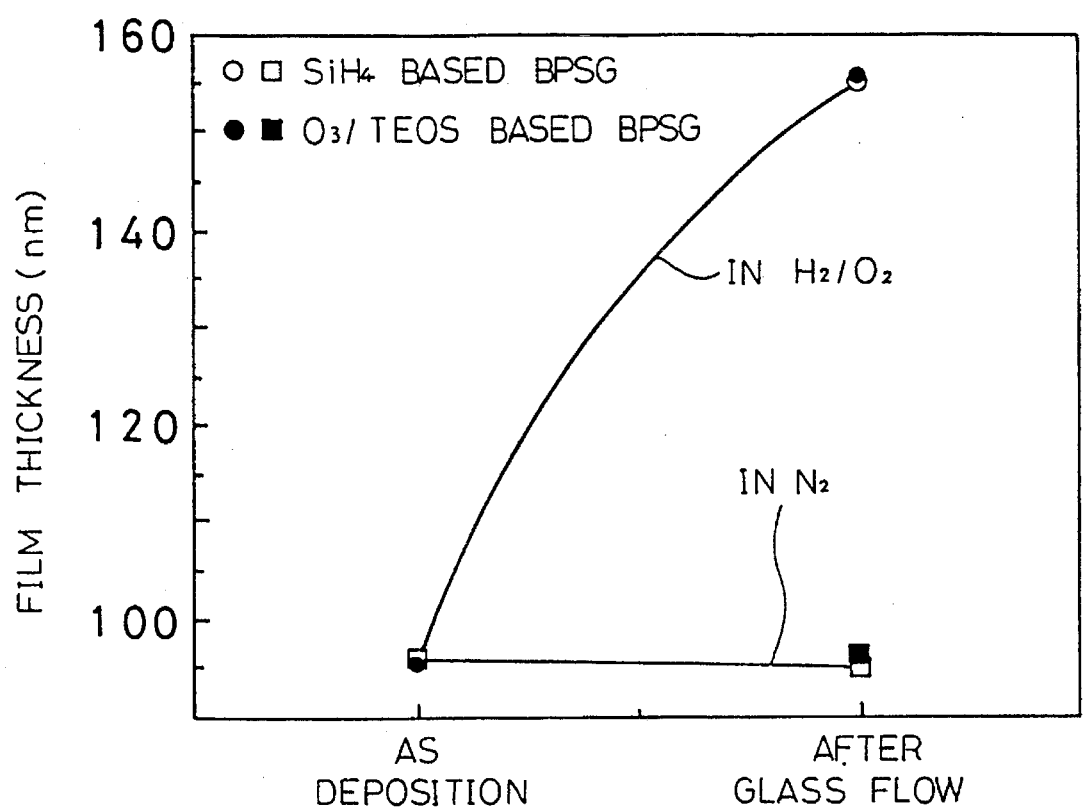
FIG. 14 is a characteristic view illustrating the amounts of oxidation of wiring patterns below the BPSG layers after respectively subjected to glass flow planarization in a nitrogen atmosphere and to glass flow planarization in a pyrogenic atmosphere according to the conventional semiconductor device producing method.

FIG. 12 (a) to (h) are schematic section views for illustrating the respective steps of a semiconductor device producing method according to a fourth embodiment of the present invention.

As shown in FIG. 12 (a), gate electrodes 3 of polysilicon are formed, through gate oxide layers 2, on a semiconductor substrate 1 incorporating MOS transistors and the like.

As shown in FIG. 12 (b), a BPSG layer 4 is deposited on the semiconductor substrate 1 and the gate electrodes 3. Then, the BPSG layer 4 is simultaneously spin-coated with a hydrophobic molecular layer of hexamethyl disilazine and subjected to a silylation reaction. As shown in FIG. 12 (c), a first molecular layer 8A is formed on the surface of the BPSG layer 4.

As shown in FIG. 12 (d), the BPSG layer 4 on which the first molecular layer 8A has been formed, is subjected to a heating treatment, causing the glass in the BPSG layer 4 to be softened so that the BPSG layer 4 is flowingly flattened. As shown in FIG. 12 (e), a second molecular layer 8B is then formed on the flattened BPSG layer 4.

As shown in FIG. 12 (f), first photoresists 6A are formed in a desired resist pattern on the second molecular layer 8B, and the BPSG layer 4 is then etched. As shown in FIG. 12 (g), the first photoresists 6A are removed and a metallic layer 7 of an aluminium-based alloy serving as an upper electrode is then formed on the BPSG layer 4 by a sputtering method.

Second photoresists (not shown) corresponding to a wiring pattern are formed on the metallic layer 7, and the metallic layer 7 is then etched. Then, the second photoresists are removed to form a wiring pattern 7' as shown in FIG. 12 (h), thus forming a semiconductor device.

The fourth embodiment is characterized in that the second molecular layer 8B is formed on the BPSG layer 4 after the BPSG layer 4 has been subjected to glass flow planarization shown in FIG. 12 (d). Normally, glass flow planarization remarkably reduces the generation of precipitates. The fourth embodiment can securely prevent the generation of precipitates which are liable to be generated in a highly humid atmosphere or when the concentration uniformity in the BPSG layer 4 greatly varies so that B and P are locally present.

In the embodiments above-mentioned, a BPSG layer is used as a silicon oxide layer. Instead of such a BPSG layer, there may be used phosphosilicate glass containing only P, borosilicate glass containing only B or glass containing arsenic. With the use of any of the glasses above-mentioned, the effects produced by the present invention can also be obtained.

In each of the embodiments above-mentioned, examples of a material for forming a molecular layer containing Si, include a silane compound, a siloxane compound, a disilazine compound, a trisilazine compound, a siloxysilane compound and the like. Examples of a material for forming a molecular layer containing Ge, include a germanium halide compound, an amino germanium compound, a germanium ether compound and the like.

Examples of the silane compound include piperidinomethyltrimethyl silane, 3-arylaminopropyltrimetoxysilane, butylaminomethylsilane and the like. Examples of the siloxane compound include pentamethyl-3-piperidinopropyldisiloxane, hexapropyldisiloxane, 3-(3-chloropropyl)heptamethyltrisiloxane and the like. Examples of the disilazine include hexamethyldisilazine, tetramethyldisilazine, heptamethyldisilazine and the like. Examples of the siloxysilane compound include tris(trimethylsiloxy)silane, 3-chloropropyltris(trimethylsiloxy)silane, 3-piperazinopropyltris(trimethylsiloxy)silane, and the like. Examples of the germanium halide compound include trimethylchlorogermane, dimethyldichlorogermane, ethyltrigermane fluoride and the like. Examples of the aminogermanium compound include trimethylgelmilediethylamine, bis(triethylgelmile)amine, tris(t-rimethylgelmile)amine and the like. Examples of the germanium ether compound include trimethyletoxygermane, tetramethoxygermane, dimethyldibutoxygermane and the like.

What is claimed is:

1. A thin layer forming method comprising:

a first step of forming, on a substrate, a silicon oxide layer containing at least one substance selected from the group consisting of boron, phosphorus and arsenic by chemical vapor deposition;

a second step of forming a first molecular layer for preventing said substance from absorbing moisture which comprises molecules having hydrophobic groups, on the surface of said silicon oxide layer formed at said first step;

a third step of thermally heating said silicon oxide layer on the surface of which said first molecular layer has been formed at said second step;

a fourth step of forming a second molecular layer comprising molecules having hydrophobic groups, on the surface of said silicon oxide layer as thermally treated at said third step; and a fifth step of forming a thin layer on said silicon oxide layer on the surface of which said second molecular layer has been formed at said fourth step wherein said second step is carried out before precipitates are generated on the surface of said silicon oxide layer formed at said first step.

2. A thin layer forming method according to claim 1, wherein:

the second step is adapted to supply a material containing hydrophobic groups bonded with silicon or germanium, onto the silicon oxide layer formed at the first step, so that said hydrophobic groups are bonded with oxygen of said silicon oxide layer, thus forming, on the surface of said silicon oxide layer, the first molecular layer comprising molecules having said hydrophobic groups, said hydrophobic groups of said molecules of said first molecular layer preventing moisture from entering said silicon oxide layer; and the fourth step is adapted to supply a material containing hydrophobic groups bonded with silicon or germanium, onto said silicon oxide layer as thermally treated at said third step, so that said hydrophobic groups are bonded with oxygen of said silicon oxide layer as thermally treated, thus forming, on the surface of said silicon oxide layer, the second molecular layer comprising molecules having said hydrophobic groups, said hydrophobic groups of said molecules of said second molecular layer preventing moisture from entering said silicon oxide layer.

3. A semiconductor device producing method comprising:

a first step of forming, on a semiconductor substrate having a transistor zone, a silicon oxide layer containing at least one substance selected from the group consisting of boron, phosphorus and arsenic by chemical vapor deposition;

a second step of supplying a material containing hydrophobic groups bonded with silicon or germanium, onto said silicon oxide layer formed at said first step, so that said hydrophobic groups are bonded with oxygen of said silicon oxide layer, thus forming, on the surface of said silicon oxide layer, a first molecular layer comprising molecules having said hydrophobic groups, said hydrophobic groups of said molecules of said first molecular layer preventing moisture from entering said silicon oxide layer;

a third step of thermally treating said silicon oxide layer on the surface of which said first molecular layer has been formed at said second step;

a fourth step of supplying a material containing hydrophobic groups bonded with silicon or germanium, onto said silicon oxide layer as thermally treated at said third step, so that said hydrophobic groups are bonded with oxygen of said silicon oxide layer as thermally treated, thus forming, on the surface of said silicon oxide layer, a second molecular layer comprising molecules having said hydrophobic groups, said hydrophobic groups of said molecules of said second molecular layer preventing moisture from entering said silicon oxide layer; and a fifth step of forming a wiring layer, directly on or through an insulating layer, on said silicon oxide layer on the surface of which said second molecular layer has been formed at said fourth step wherein said second step is carried out before precipitates are generated on the surface of said silicon oxide layer formed at said first step.

* * * * *

UNITED STATES PATENT AND TRADEMARK OFFICE
CERTIFICATE OF CORRECTION

PATENT NO. : 5,576,247
DATED : November 19, 1996
INVENTOR(S) : Yano et al.

It is certified that error appears in the above-identified patent and that said Letters Patent is hereby corrected as shown below:

On the title page, item [54] and column 1, line 3, "PREVENTING" should read --PREVENT--.

Signed and Sealed this

Twenty-third Day of December, 1997

Attest:

Attesting Officer

BRUCE LEHMAN

Commissioner of Patents and Trademarks